United States Patent
Mizuuchi et al.

(10) Patent No.: US 7,835,409 B2
(45) Date of Patent: Nov. 16, 2010

(54) ILLUMINATION LIGHT SOURCE DEVICE AND LASER PROJECTION DEVICE

(75) Inventors: Kiminori Mizuuchi, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 84 days.

(21) Appl. No.: 12/281,058

(22) PCT Filed: Feb. 22, 2007

(86) PCT No.: PCT/JP2007/053268

§ 371 (c)(1),
(2), (4) Date: Aug. 28, 2008

(87) PCT Pub. No.: WO2007/099847

PCT Pub. Date: Sep. 7, 2007

(65) Prior Publication Data

US 2009/0067459 A1      Mar. 12, 2009

(30) Foreign Application Priority Data

Mar. 3, 2006   (JP) .............................. 2006-057400

(51) Int. Cl.
*H01S 3/10* (2006.01)
(52) U.S. Cl. .............................. 372/25; 372/24; 372/26; 372/34; 372/96; 372/99; 372/102; 362/259
(58) Field of Classification Search .................. 372/24, 372/26, 34, 96, 99, 102, 25; 362/259
See application file for complete search history.

(56) References Cited

U.S. PATENT DOCUMENTS

RE35,962 E * 11/1998 Ball et al. ...................... 372/6
5,870,417 A * 2/1999 Verdiell et al. ................ 372/32
6,058,128 A * 5/2000 Ventrudo ....................... 372/96
6,215,809 B1 * 4/2001 Ziari et al. ..................... 372/96
6,259,711 B1 * 7/2001 Laurell ......................... 372/22

(Continued)

FOREIGN PATENT DOCUMENTS

JP      1-262684      10/1989

(Continued)

OTHER PUBLICATIONS

International Search Report issued May 22, 2007 in the International (PCT) Application No. PCT/JP2007/053268.

*Primary Examiner*—Minsun Harvey
*Assistant Examiner*—Yuanda Zhang
(74) *Attorney, Agent, or Firm*—Wenderoth, Lind & Ponack, L.L.P.

(57) ABSTRACT

An illumination light source is provided with a laser light source having a laser medium with a specified gain region, and a reflector having a narrow band reflection characteristic. A part of a laser light emitted from the laser light source is reflected and fed back by the reflector, so that an oscillation wavelength of the laser light source is fixed at a reflection wavelength. A peak of a gain region of the laser medium is shifted from the reflection wavelength by a change of an oscillation characteristic of the laser light source, so that the oscillation wavelength of the laser light source is changed from the reflection wavelength. Thus, an oscillation spectrum of the laser light source is spread to reduce speckle noise.

30 Claims, 18 Drawing Sheets

U.S. PATENT DOCUMENTS

| | | | |
|---|---|---|---|
| 6,411,639 B1 * | 6/2002 | Namiwaka | 372/92 |
| 6,625,192 B2 * | 9/2003 | Arbel et al. | 372/69 |
| 6,738,398 B2 * | 5/2004 | Hirata et al. | 372/32 |
| 7,317,739 B2 * | 1/2008 | Chou et al. | 372/18 |
| 2001/0046250 A1 * | 11/2001 | Arbel et al. | 372/108 |
| 2002/0015433 A1 * | 2/2002 | Zimmermann | 372/96 |
| 2002/0154375 A1 | 10/2002 | Roddy et al. | |

FOREIGN PATENT DOCUMENTS

| | | |
|---|---|---|
| JP | 2000-49419 | 2/2000 |
| JP | 2001-102681 | 4/2001 |
| JP | 2001-189520 | 7/2001 |
| JP | 2002-323675 | 11/2002 |

* cited by examiner

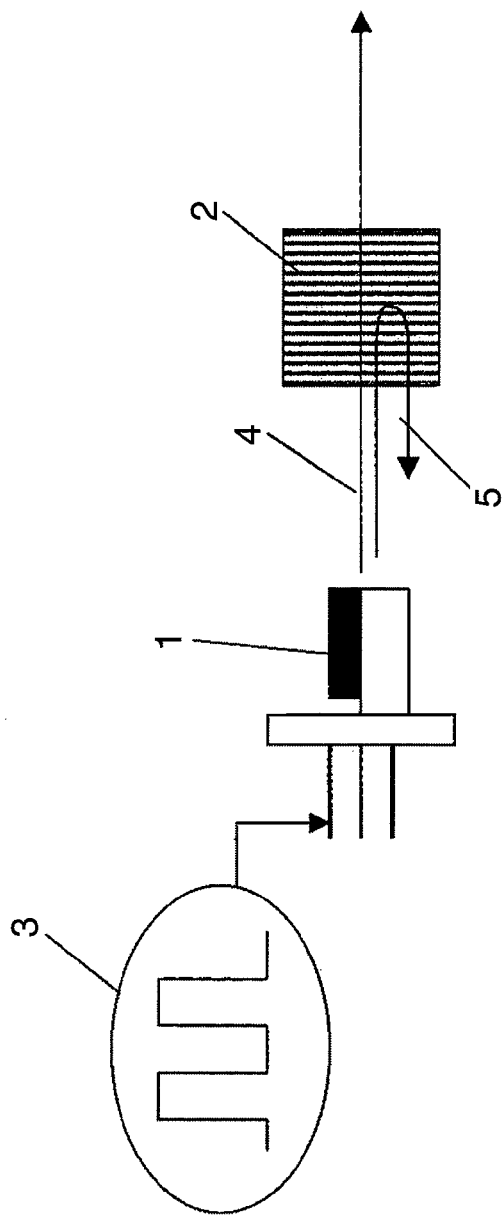
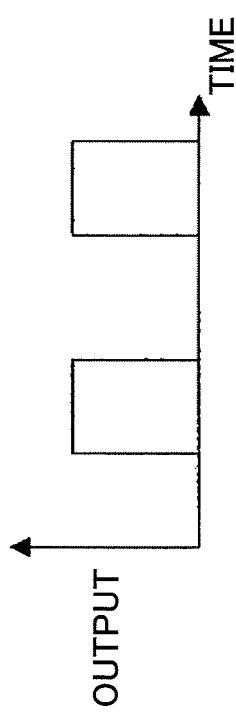
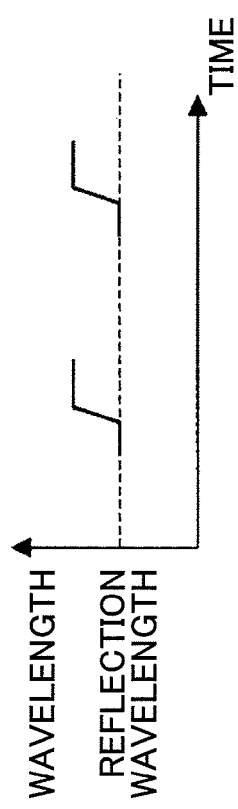
FIG.1A
FIG.1B
FIG.1C

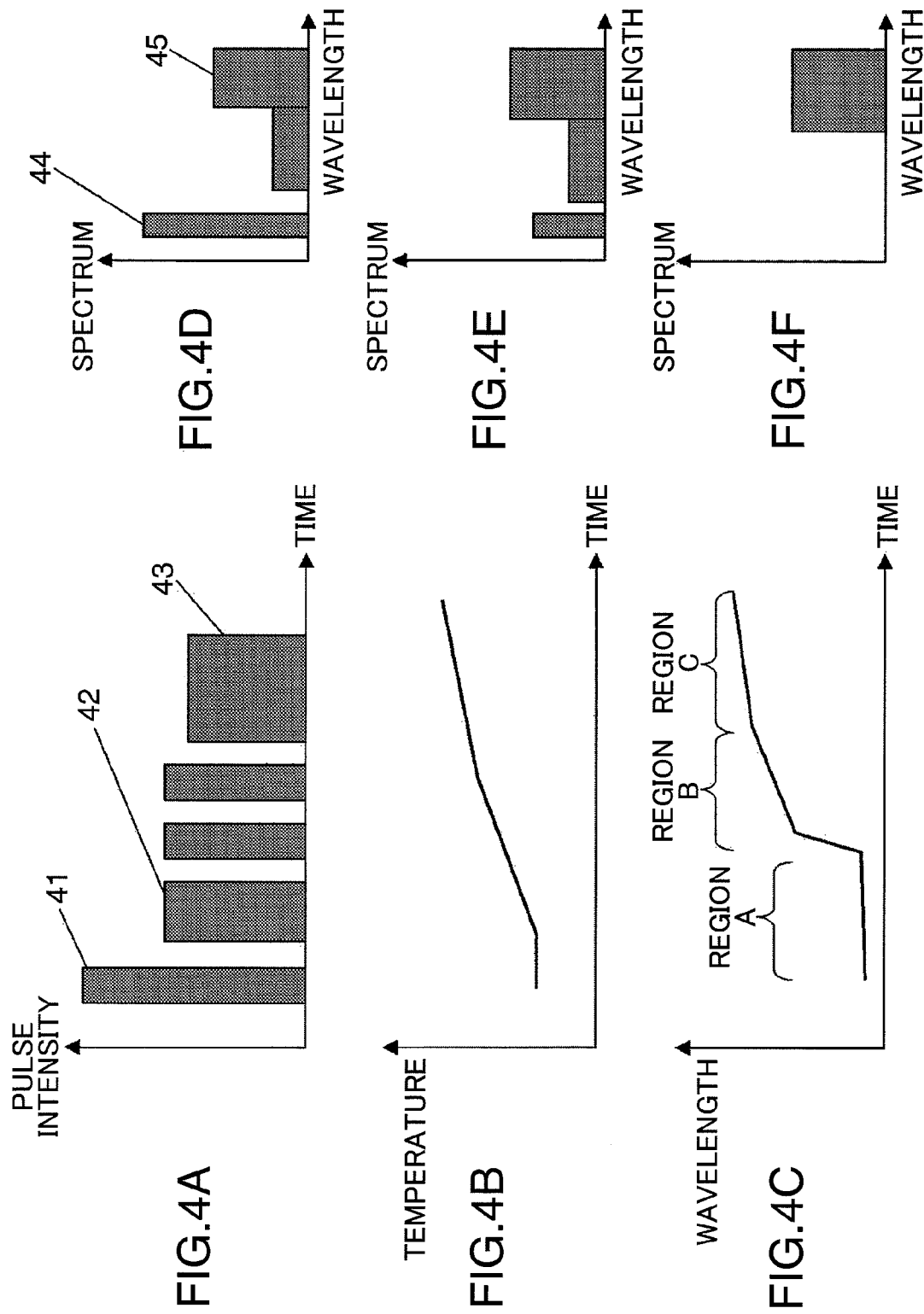

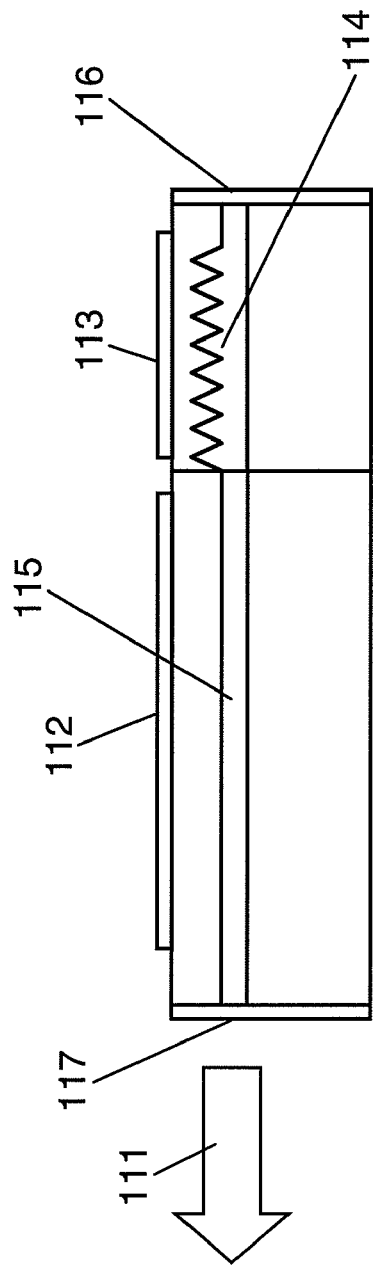
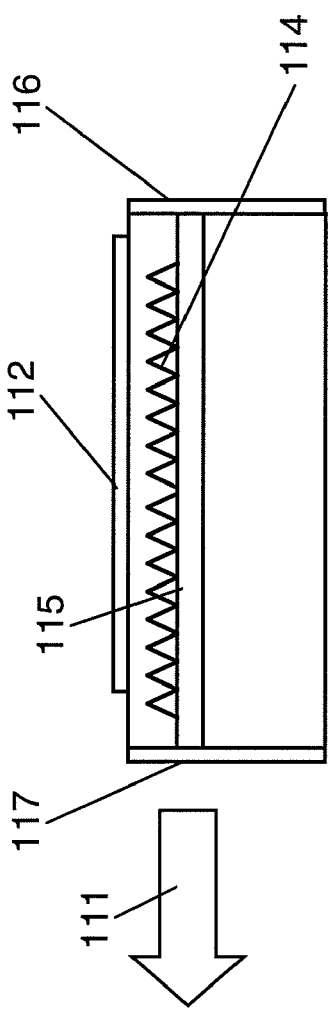
FIG.11A
FIG.11B

ILLUMINATION LIGHT SOURCE DEVICE AND LASER PROJECTION DEVICE

BACKGROUND OF THE INVENTION

1. Field of Invention

The present invention relates to an illumination light source with little speckle noise and a laser projection device using such an illumination light source.

2. Description of the Related Art

Semiconductor lasers made of III-V nitride semiconductor materials ($Al_xGa_yIn_{1-x-y}N$ (where $0 \leq x \leq 1$, $0 \leq y \leq 1$), such as gallium nitride and red semiconductor lasers made of AlGaAs semiconductor materials or AlGaInP semiconductor materials are key devices for achieving ultra-high density recording by optical disks. Similarly, higher outputs of these visible light semiconductor lasers not only enable high-speed writing of optical disks, but also are essential technology for pioneering new technological fields such as application to laser displays.

What is problematic in the case of utilizing a visible light semiconductor laser as an illumination light source for a projection device, a display device or the like is speckle noise. Speckle noise is a phenomenon in which a light reflected from an object being illuminated has its wavefront disturbed by the unevenness of the surface of the object being illuminated and a random interference pattern is observed in the case where a light with high coherence such as a laser light is utilized as an illumination light source. A glaring speckle pattern is observed in the reflected light, which causes the image degradation of the projection device and the display device.

Several methods for reducing the coherence of a light source have been proposed as methods for reducing such speckle noise. The first method is for reducing spatial coherence and represented by the vibration of a screen, to which a laser light is projected. According to this method, speckle noise is reduced by giving a spatial variation in an optical path of the laser light and an optical system.

On the other hand, there is also proposed a method for directly reducing the coherence of a semiconductor laser light. This is a method for reducing the coherence of a light source as disclosed in patent literature 1. According to this second method, the spectral width of an oscillation wavelength is increased to reduce the coherence by superimposing a high frequency wave on the drive of the semiconductor laser.

However, the above first method for spatially changing the laser light requires a mechanical driving system in the optical system and has a problem of enlarging and complicating the optical system. Further, it is difficult to completely suppress the speckle noise only by giving the spatial variation.

On the other hand, the above second method for multimoding the spectrum of the semiconductor laser is effective in reducing the coherence, but no sufficient coherence reducing effect can be obtained unless the spectral width is increased to 1 nm or larger. Only by superimposing the high frequency wave on the drive of the semiconductor laser, there has been a problem that an increase of the spectral width and a speckle noise reducing effect are insufficient.

Patent Literature 1

Japanese Unexamined Patent Publication No. 2002-323675

BRIEF SUMMARY OF THE INVENTION

An object of the present invention is to realize an illumination light source with little speckle noise and a laser projection device using such an illumination light source by increasing the oscillation spectral width of a laser light source.

One aspect of the present invention is directed to an illumination light source, comprising a laser light source having a laser medium with a specified gain region and a reflector having a narrow band reflection characteristic, wherein the reflection wavelength of the reflector is set in the gain region of the laser medium. A part of a laser light emitted from the laser light source is fed back to the laser light source by being reflected by the reflector, and the oscillation wavelength of the laser light source changes from the reflection wavelength by shifting a peak of the gain region of the laser medium from the reflection wavelength through a change of the oscillation characteristic of the laser light source.

In the above illumination light source, an oscillating light of the laser light source is fixed at the wavelength of the reflector by reflecting and feeding the part of the laser light emitted from the laser light source back to the laser light source using the reflector. By changing the oscillation characteristic of the laser light source, the peak of the gain region of the laser light source is shifted from the fixed reflection wavelength. Thus, the oscillation spectral width of the laser light source spreads to reduce coherence since the oscillation wavelength of the laser light source can be largely changed. Therefore, an illumination light source with little speckle noise can be realized.

BRIEF DESCRIPTION OF THE DRAWINGS

FIG. 1A is a diagram showing a construction of an illumination light source according to a first embodiment of the invention, FIG. 1B is a graph showing an output characteristic of a semiconductor laser and FIG. 1C is a graph showing an oscillation wavelength characteristic of the semiconductor laser, FIG. 4A is a graph showing an example of a pulse train of a drive current to be applied to the semiconductor laser, FIG. 4B is a graph showing a temperature change of an active layer of the semiconductor laser at the time of applying the driving current with the pulse train of FIG. 4A, FIG. 4C is a graph showing an oscillation wavelength characteristic of the semiconductor laser at the time of applying the driving current with the pulse train of FIG. 4A, and FIGS. 4D to 4F are graphs showing distributions of the oscillation spectrum of the semiconductor laser at the time of applying the driving current with the pulse train of FIG. 4A, FIG. 11A is a section showing a structure of a DBR laser and FIG. 11B is a section showing a structure of a DFB laser, FIGS. 13A and 13B are graphs showing a method for driving a semiconductor laser of an illumination light source according to a third embodiment of the invention, wherein FIG. 13A shows a current waveform in which a high frequency wave is superimposed on a drive current of the semiconductor laser wavelength-locked by an optical feedback and FIG. 13B shows an oscillation spectrum of the semiconductor laser having the drive current with the waveform of FIG. 13A applied thereto, FIGS. 14A and 14B are graphs showing another method for driving the semiconductor laser of the illumination light source according to the third embodiment of the invention, wherein FIG. 14A shows a current waveform in which a high frequency wave is superimposed on the drive current of the semiconductor laser wavelength-locked by an optical feedback and FIG. 14B shows an oscillation spectrum of the semiconductor laser having the drive current with the waveform of FIG. 14A applied thereto, FIGS. 15A and 15B are graphs showing still another method for driving the semiconductor laser of the illumination light source according to the third embodiment of the invention, wherein FIG. 15A shows a current waveform in which a high frequency wave is superimposed on the drive current of the semiconductor laser wavelength-locked by an optical feedback and FIG. 15B shows an oscillation spectrum of the semiconductor laser having the drive current with the waveform of FIG. 15A applied thereto.

DETAILED DESCRIPTION OF THE INVENTION

Figure 2A:
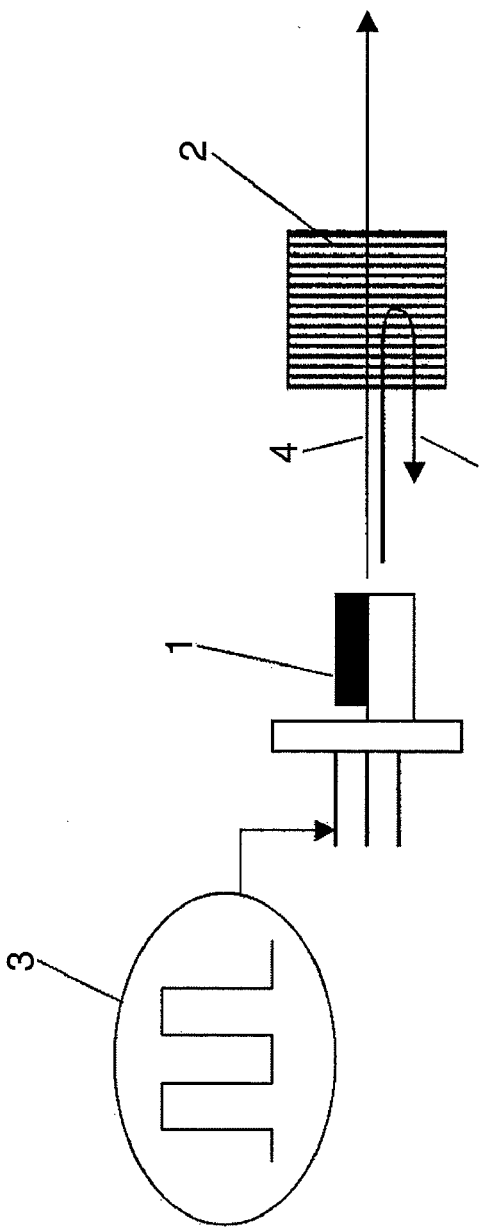
FIG. 2A is a diagram showing the construction of the illumination light source according to the first embodiment of the invention.

Hereinafter, embodiments of the present invention are described with reference to the accompanying drawings. In the following description of the drawings, same or similar elements are identified by same or similar reference numerals and may not be repeatedly described in some cases.

First Embodiment

FIG. 1A is a diagram showing a construction of an illumination light source according to a first embodiment of the present invention. In FIG. 1A, the illumination light source according to this embodiment is provided with a semiconductor laser 1 as a light source and a reflector 2 for reflecting a part of an emitted light 4 from the semiconductor laser 1 as a basic construction. The emitted light 4 from the semiconductor laser 1 has a part thereof with a specific wavelength reflected by the reflector 2 having a narrow band reflection characteristic, and a reflected light 5 is incident on an active layer of the semiconductor laser 1. An oscillation wavelength of the semiconductor laser 1 is fixed to a reflection wavelength by an optical feedback of the reflected light 5 returned to the active layer. This semiconductor laser 1 is pulse-driven by a driving power supply 3. An output at this time is shown in FIG. 1B. As shown in FIG. 1B, the output of the semiconductor laser 1 is in the form of a pulse train. The illumination light source according to this embodiment is characterized in that the wavelength of the semiconductor laser 1 largely changes in one pulse as shown in FIG. 1C. In other words, the oscillation wavelength of the semiconductor laser 1 changes from the reflection wavelength to another wavelength in one pulse, thereby increasing a spectral change to spread the oscillation spectrum of the semiconductor laser 1. As a result, it becomes possible to reduce the coherence of the semiconductor laser 1 and to generate a light with little speckle noise.

Figure 2B:
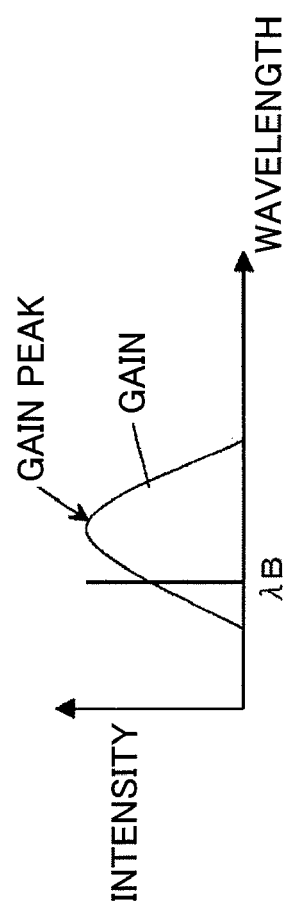
FIG. 2B is a graph showing an oscillation spectrum characteristic of the semiconductor laser and FIG. 2C is a graph showing the oscillation wavelength characteristic of the semiconductor laser.
Figure 2C:
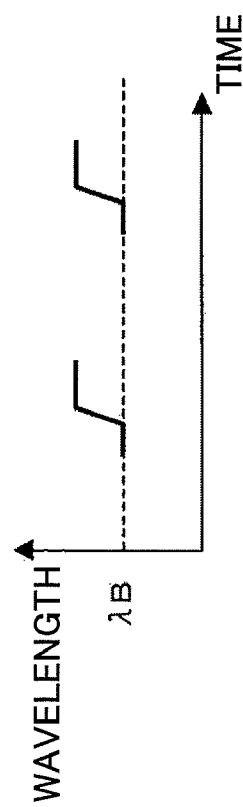

This principle is described with reference to FIGS. 2A to 2C.

The oscillation of the semiconductor laser 1 is determined by a loss-gain relationship in the active layer. At an initial stage of pulse generation, loss decreases for the reflected light 5 returned by the reflector 2 and the oscillation wavelength is fixed to a specific reflection wavelength $\lambda B$ from the reflector 2 since the temperature of the active layer is low. However, if the temperature of the active layer of the semiconductor laser 1 increases in one pulse, a gain region of the semiconductor laser 1 is shifted to a long wavelength side as shown in FIG. 2B. As a result, gain at a reflection wavelength $\lambda B$ decreases and the oscillation wavelength of the semiconductor laser 1 is shifted to the peak of the gain from the reflection wavelength $\lambda B$, whereby the oscillation wavelength of the semiconductor laser 1 largely changes. As shown in FIG. 2C, the oscillation wavelength of the semiconductor laser 1 is shifted from the reflection wavelength $\lambda B$ of the reflector 2 to another wavelength in one pulse, whereby the oscillation wavelength of the semiconductor laser 1 largely changes and the oscillation spectrum is spread to reduce the coherence. Thus, a speckle noise reducing effect increases.

Next, a construction for strengthening a speckle noise suppressing effect by increasing a spectral change of the semiconductor laser in the illumination light source is described.

Firstly, the gain region of the semiconductor laser 1 and the reflection wavelength $\lambda B$ of the reflector 2 are designed to satisfy the following relationship. As shown in FIG. 2B, the value of the reflection wavelength $\lambda B$ of the reflector 2 is preferably set to be shorter than the peak (gain peak) of a gain wavelength of the semiconductor laser 1 at room temperature. Even in normal pulse oscillation, a temperature change occurs in the active layer, the oscillation spectrum is shifted from a shorter wavelength to a longer wavelength in one pulse and the value thereof is 1 nm or shorter. On the contrary, the range of the spectral wavelength variation can be made larger than the variation range of the gain peak by setting the reflection wavelength λB to be shorter than the gain peak. In this way, the wavelength is changed over a wavelength range of 1 nm or longer to reduce the speckle noise. The oscillation wavelength largely changes in the case of deviation from the oscillation wavelength λB, wherefore the spectral width can be increased.

Secondly, the reflectance of the reflector 2 is preferably about 1% to 10%. It is difficult to fix the oscillation wavelength to the reflection wavelength λB by the optical feedback if the reflectance is equal to or below 1%, and the oscillation wavelength of the semiconductor laser 1 deviates during the pulse drive and a phenomenon of shifting to the gain peak is unlikely to appear if the reflectance is equal to or above 10%.

Thirdly, the narrow band characteristic of the reflector 2 for returning the reflected light 5 to the active layer of the semiconductor laser 1 is also important. The narrow band characteristic of the reflector 2 is preferably a wavelength width of 5 nm or shorter, more preferably that of 1 nm or shorter. If the reflection wavelength width is widened, wavelength selectivity in the active layer decreases, wherefore the fixation of the oscillation wavelength by the optical feedback becomes difficult. Thus, the wavelength width needs to be 5 nm or shorter. By reducing it to 1 nm or shorter, the selectivity of the oscillation wavelength of the semiconductor laser 1 at the reflection wavelength can be increased. Oscillation is possible when the wavelength of the semiconductor laser 1 is in a shorter wavelength range of 2 nm or longer from the gain peak, and the wavelength change by output modulation is extended to a wide wavelength range of 3 nm or longer. By largely shifting the oscillation wavelength of the semiconductor laser 1 from the gain peak, the wavelength to be changed by intensity modulation increases.

Fourthly, a high frequency wave of 1 MHz or higher is preferably superimposed on a pulse for pulse-driving the semiconductor laser 1. By superimposing the high frequency wave, the spectrum is spread and the coherence is reduced to weaken the effect of the optical feedback. Thus, a wavelength shift by the pulse drive more easily occurs. This construction is particularly effective for GaN lasers. A semiconductor laser having a GaN substrate as a base has large relaxation oscillation and, if a high frequency wave is superimposed, spike noise is generated. This is a phenomenon in which, if a current injected to the semiconductor laser is modulated by the high frequency wave, the waveform of an output light is changed to a spike shape by the relaxation oscillation to generate a pulse output having a degree of modulation many fold higher. Thus, coherence degradation by the superimposition of the high frequency wave increases to strengthen the speckle noise reducing effect. The construction for superimposing the high frequency wave on the pulse for pulse-driving the semiconductor laser is described in detail in a third embodiment to be described later.

Fifthly, the pulse width during the pulse drive is also important. The pulse width is preferably 1 μs is or longer. The wavelength shift by the pulse drive utilizes a wavelength shift in the gain region by the temperature change of the active layer of the semiconductor laser. A response frequency of the temperature change of the semiconductor laser is 1 MHz or lower and the temperature change does not follow a change at a frequency higher than this. Accordingly, the pulse drive at a frequency of 1 MHz or lower and with a pulse width of 1 μs or longer is necessary.

Figure 3A:
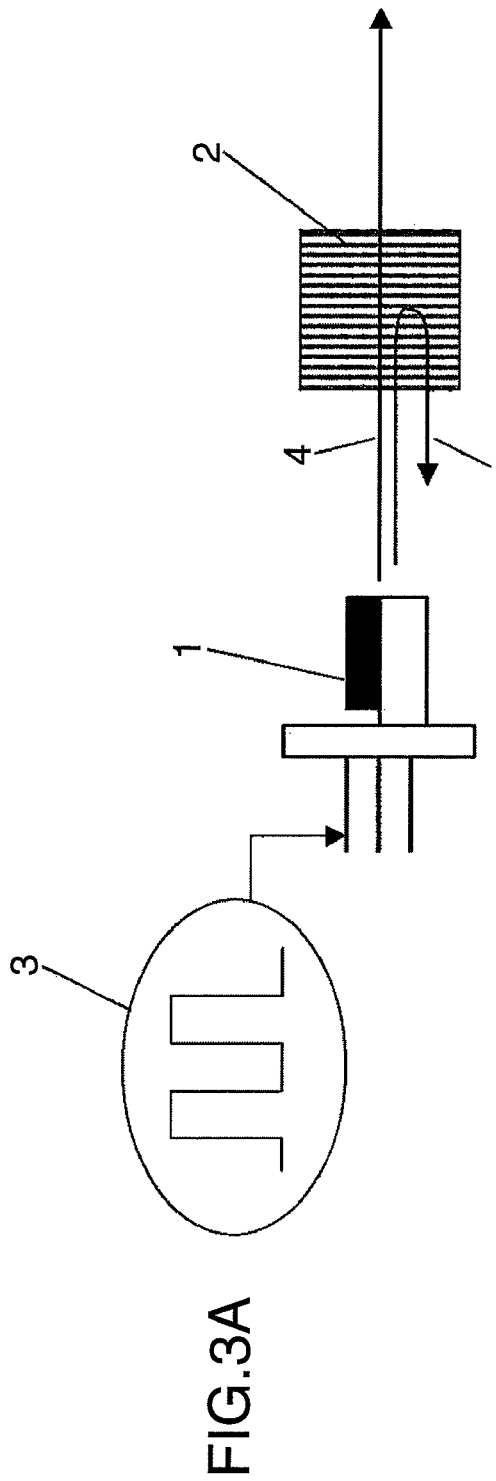
FIG. 3A is a diagram showing the construction of the illumination light source according to the first embodiment of the invention.
Figure 3B:
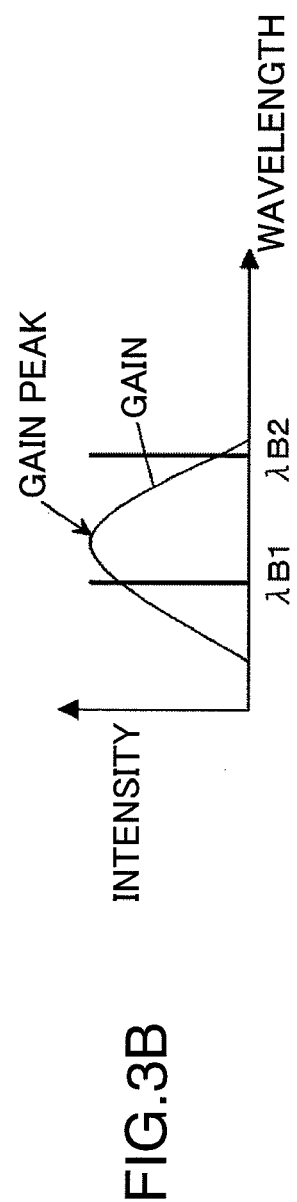
FIG. 3B is a graph showing another oscillation spectrum characteristic of the semiconductor laser and FIG. 3C is a graph showing another oscillation wavelength characteristic of the semiconductor laser.
Figure 3C:
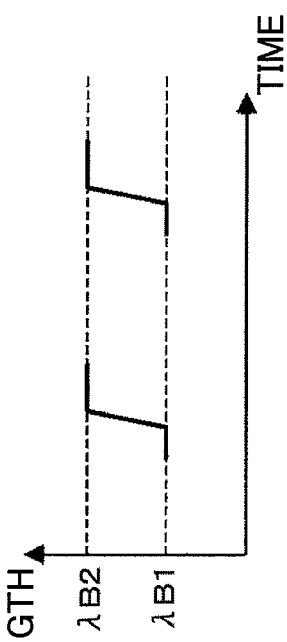

Sixthly, the reflector 2 having a plurality of reflection wavelengths is effective besides the one having one reflection wavelength in the narrow band shown in FIG. 1 since the wavelength change amount can be increased. In FIG. 3A, two reflection wavelengths λB1, λB2 are set for the reflector 2 at the opposite sides of a wavelength region wider than a movable range of the gain peak changed by the pulse drive. If the semiconductor laser 1 is pulse-driven, oscillation occurs at λB1 closer to the gain peak as shown in FIG. 3B in an initial state in one pulse. If the temperature of the active layer increases to shift the gain peak to a long wavelength side in one pulse, the gain peak approaches λB2 and, consequently, an oscillation gain at λB2 exceeds that at λB1 to transfer to the oscillation at λB2. Thus, as compared with the case where there is one reflection wavelength, the wavelength change of the semiconductor laser 1 becomes larger to strengthen the speckle noise reducing effect.

In the above construction example, the width of the pulse applied to the semiconductor laser 1 has a single rectangular shape, but the spectral shape can be controlled by changing the pulse shape. With reference to FIGS. 4A to 4F, a method for controlling a spectral distribution by the pulse shape is described. In order to suppress the speckle noise, it is effective to widen the spectral width, but the spectrum is more preferably distributed in a wide wavelength region. FIGS. 4A to 4F are graphs showing the method for controlling the spectral distribution using a pulse train.

In FIG. 4A, a pulse 41 having a high peak is oscillated in the lead, then a plurality of pulses 42 having a lower peak value are applied and finally a pulse 43 having an even lower peak value is applied. A temperature change of the active layer when the pulse train is applied is shown in FIG. 4B, and a wavelength change of the semiconductor laser at that time is shown in FIG. 4C. Since the temperature of the active layer follows a light output with a time delay, a high light output is obtained before the active layer temperature increases in a region A if the pulse 41 having a high peak value is applied at an initial stage. In the region A, the oscillation wavelength of the semiconductor laser is fixed by an optical feedback wavelength by the reflector. Thereafter, the temperature of the active layer increases with a slight time delay from the light output. If the gain peak of the semiconductor laser is shifted toward the long wavelength side by this temperature increase, oscillation starts at the gain peak at a certain point of time in addition to at the oscillation wavelength by the reflector and the oscillation wavelength of the semiconductor laser becomes unstable due to multimode oscillation (region B). Thereafter, the gain wavelength is shifted more toward the long wavelength side than the oscillation wavelength by the reflector, whereby the oscillation wavelength of the semiconductor laser changes to the oscillation wavelength at the gain peak and oscillation occurs at a longer wavelength as the temperature increases (region C).

If the temperature change of the active layer is controlled by the pulse train in this way, it becomes possible to distribute the oscillation wavelength spectrum in a wide wavelength region and to have a larger variation of the spectral distribution. The entire spectral distribution at this time is shown in FIG. 4D. A spectral distribution in the case of not using the initial peak 41 having a high peak value of FIG. 4A is shown in FIG. 4E. In this case, the spectrum decreases in a short wavelength region. On the other hand, FIG. 4F shows a spectral distribution in the absence of the optical feedback by the reflector. As is clear from FIGS. 4D to 4F, the variation of the spectral distribution becomes larger to more strengthen the speckle noise suppressing effect by using the pulse train having a high peak value. By using a plurality of pulse trains, it becomes possible to control the temperature change of the active layer and to further spread the spectral distribution.

The semiconductor laser preferably has a wide stripe structure with a stripe width of 5 μm or longer. The oscillation spectrum changes in a narrow band in a lateral mode single stripe structure, whereas it changes with a wider spectral width by multimoding the lateral mode. Thus, an average spectral shape becomes smoother. By adopting the wide stripe structure, higher outputs can be obtained and the lateral oscillation mode can be multimoded. By multimoding the lateral mode, a plurality of lateral modes can be excited to spread the oscillation spectrum of the semiconductor laser. When the wavelength is fixed by the optical feedback and this fixed wavelength is spectrally changed by the pulse drive, the spectral width is widened to increase a spectral dispersion by the multimoding of the lateral mode, whereby the speckle noise can be drastically reduced.

Even with other lasers such as AlGaAs semiconductor materials and AlGaInP semiconductor materials, oscillation with a wide spectrum becomes possible and outputs with little speckle noise can be generated by simultaneously adding the optical feedback and the output modulation.

Further, an output increase and a remarkable spectrum increase are obtained by utilizing a multi-stripe laser. By arranging reflectors having different reflection wavelengths at multiple strips, the respective stripes oscillate at different wavelengths and the oscillation wavelength is changed by the pulse drive. Thus, oscillation can occur in an overall wide wavelength range. As a result, it becomes possible to drastically reduce the coherence of the laser light and to drastically reduce the speckle noise.

Further, by forming a part of the semiconductor laser near an output end to have a window structure, it becomes possible to stabilize outputs and to obtain higher outputs. A waveguide window structure prevents the destruction of an output end surface and is effective in obtaining higher outputs. It is more effective for a construction using the optical feedback as in the present invention. By causing a light to return from the outside by the optical feedback, light power density at the end surface further increases and the deterioration of the end surface becomes notable. Particularly in the case of generating a high output light by the pulse drive, the end surface deterioration is more likely to occur. Therefore, by adopting the window structure at the end surface, higher outputs could be achieved and, simultaneously, a light source with high reliability could be realized.

Figure 5:
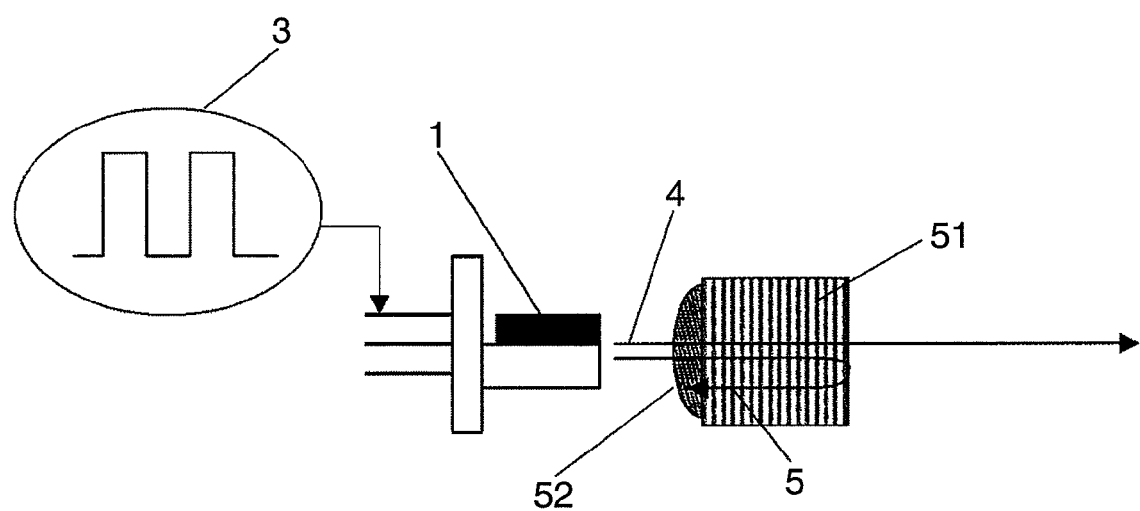
FIG. 5 is a diagram showing a construction using a volume grating as a reflector of the illumination light source according to the first embodiment of the invention.

Next, the construction of the reflector 2 of FIG. 1A is described. There are many constructions for the reflector 2. The reflector 2 is required to have a narrow band characteristic for reflecting a specific wavelength. In an illumination light source shown in FIG. 5, a construction using a volume grating is employed as a reflector 51. The volume grating 51 as a reflector is such that a refractive index grating is formed in a dielectric element and can reflect a light of a specific wavelength by Bragg reflection. The emitted light 4 from the semiconductor laser 1 is collimated by a lens 52 and the specific wavelength is reflected by the volume grating 51, whereby the wavelength of the semiconductor laser 1 can be fixed. In this way, the construction of the present invention can be realized. Since the volume grating 51 is easily constructed to have a small size, a small-size illumination light source can be realized. Further, since the grating can be formed by interference exposure, there is a feature that a construction for reflecting a plurality of reflection wavelengths can also be easily realized.

Figure 6:
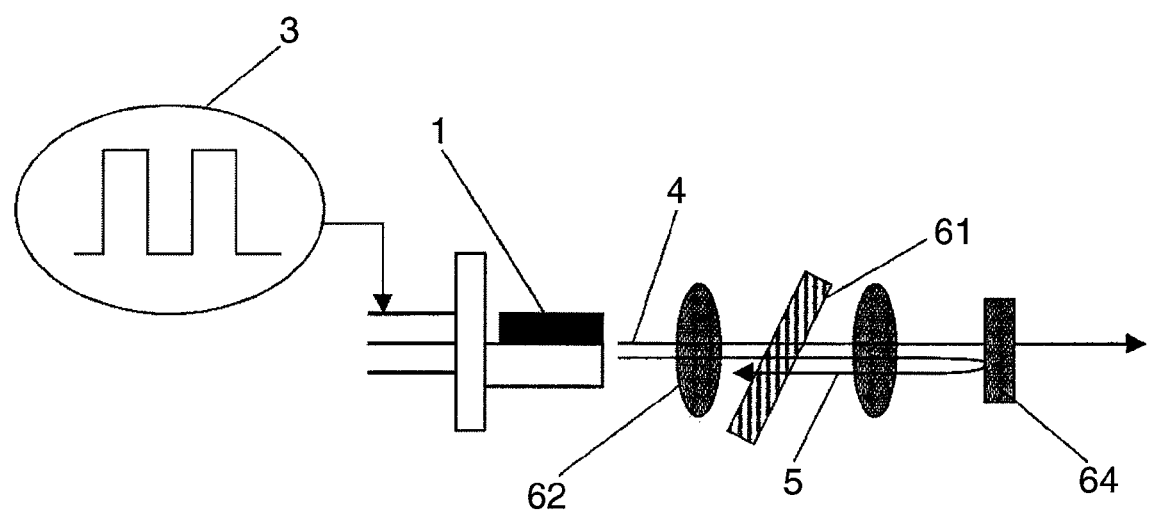
FIG. 6 is a diagram showing a construction using a narrow band filter as the reflector of the illumination light source according to the first embodiment of the invention.

In an illumination light source shown in FIG. 6, a combined construction of a lense/lenses 62, a narrow band filter 61 and a reflector 64 is adopted. A specific wavelength is fed back to the semiconductor laser 1 by reflecting a part of a light having passed through the narrow band filter 61 using the reflector 64. A construction for wavelength locking can be realized by this feedback of the specific wavelength. The inventive construction can be realized by this construction.

Figure 7:
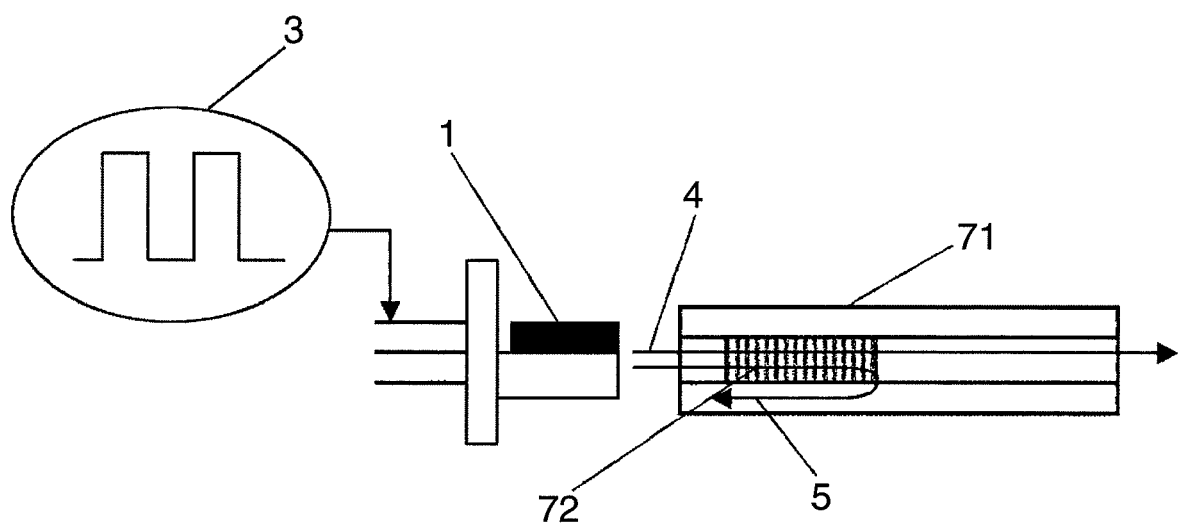
FIG. 7 is a diagram showing a construction using a fiber formed with a grating as the reflector of the illumination light source according to the first embodiment of the invention.

In an illumination light source shown in FIG. 7, a construction utilizing a fiber grating 72 formed in a fiber 71 is adopted. The semiconductor laser 1 is wavelength-locked by a grating fiber having the grating 72 formed in the fiber 71, and the inventive construction can be realized by pulse-driving this semiconductor laser 1.

Figure 8A:
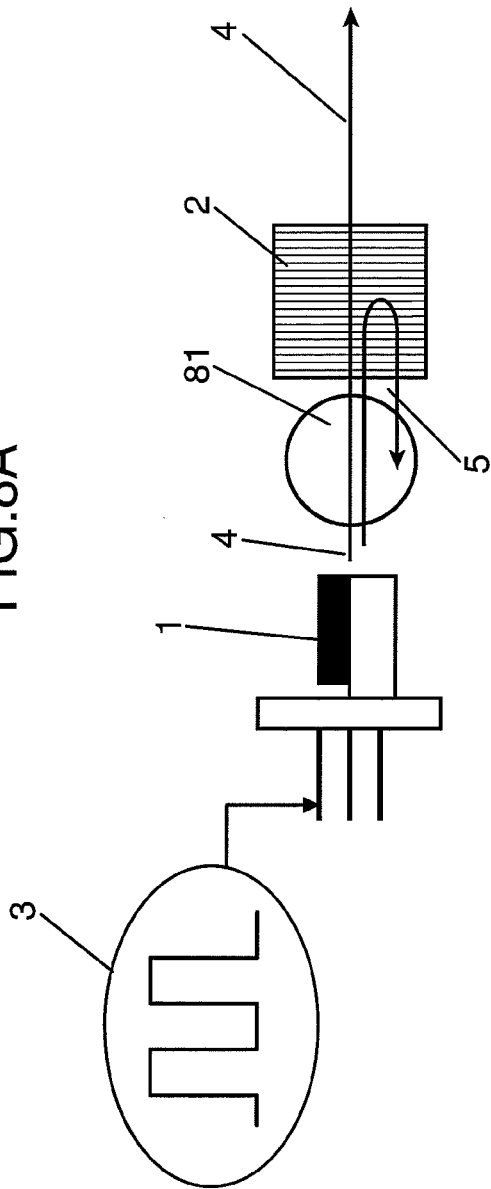
FIG. 8A is a diagram showing a construction of a light source used for the characteristic evaluation of the oscillation wavelength of the illumination light source according to the first embodiment of the invention.

Next, the result of the characteristic evaluation on the oscillation wavelength of an illumination light source according to this embodiment is described. FIG. 8A shows a construction of the illumination light source used in this evaluation. The illumination light source used in this evaluation is provided with a semiconductor laser 1, a reflector 2 for reflecting a part of an emitted light 4 from the semiconductor laser 1 and a lens 81 arranged between the semiconductor laser 1 and the reflector 2 as a basic construction. An experiment on the oscillation wavelength of the semiconductor laser 1 was conducted using the illumination light source of FIG. 8A and the oscillation spectrum of the semiconductor laser 1 was observed.

In the illumination light source of FIG. 8A, the light 4 emitted from the semiconductor laser 1 is collimated by the lens 81, a part thereof is reflected by the reflector 2 and this reflected light 5 is returned to an active layer of the semiconductor laser 1. The reflector 2 is formed by a volume grating and has a narrow band reflection characteristic by Bragg reflection. The reflection wavelength of the reflector 2 is set at 808 nm, and the oscillation wavelength of the semiconductor laser 1 is fixed in the neighborhood of 808 nm as the reflection wavelength. The semiconductor laser 1 is a wide stripe laser with a stripe width of 200 μm and the lateral mode thereof is a multimode.

Figure 8B:
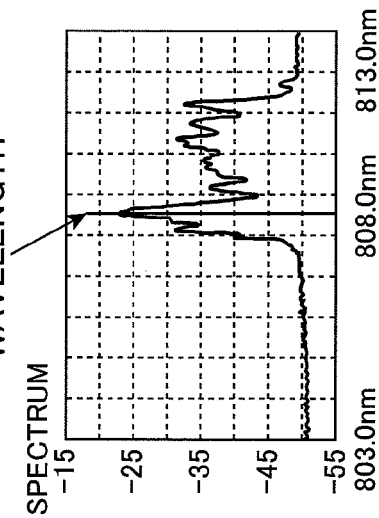
FIGS. 8B and 8C are graphs showing observation results on the oscillation spectra of the semiconductor laser.
Figure 8C:
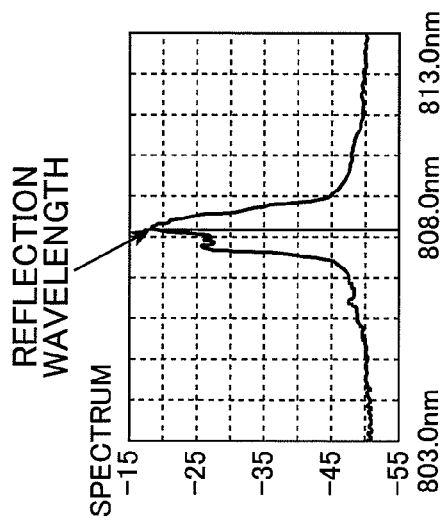

In the illumination light source having such a construction, an output was increased while the semiconductor laser 1 was modulated by about 200 Hz and the oscillation spectrum was observed by a spectrum analyzer. The observation result is shown in FIGS. 8B and 8C. FIG. 8B shows a case where the peak output of the semiconductor laser 1 is below 2 W, and it can be understood that the oscillation wavelength of the semiconductor laser 1 is fixed at the reflection wavelength 808 nm of the reflector 2. The oscillation spectrum has a slight spread because the semiconductor laser 1 is a wide stripe multimode laser. On the other hand, FIG. 8C shows a case where the peak output exceeded 3 W by increasing the output of the semiconductor laser 1. In this case, it can be understood that the oscillation wavelength of the semiconductor laser 1 spread to wavelengths other than the reflection wavelength 808 nm of the reflector 2. Specifically, the oscillation spectrum spread toward the long wavelength side by about 5 nm from the reflection wavelength 808 nm. This results from the fact that the gain peak wavelength of the semiconductor laser 1 is longer than the reflection wavelength of 808 nm. As the output of the semiconductor laser 1 increased, the temperature of the active layer of the semiconductor laser 1 increased and the gain peak was shifted toward the long wavelength side.

In this way, it was confirmed that the oscillation spectrum of the semiconductor laser 1 could be spread by modulating the output of the semiconductor laser 1 having the oscillation wavelength locked by the reflector 2.

As described above, it is preferable to use a wide stripe multimode laser as the semiconductor laser 1. Its stripe width is preferably equal to or longer than 10 μm and equal to or shorter than 200 μm. By increasing the stripe width to or above 10 μm, it becomes possible to increase the output and to multimode the lateral mode. By multimoding the lateral mode, the locking of the oscillation wavelength at the reflection wavelength of the reflector 2 becomes weaker. Thus, the oscillation wavelength becomes easier to unlock and the spectrum can be easily changed by the output modulation. On the other hand, if the stripe width is equal to or longer than 200 µm, the locking conversely becomes weaker than necessary due to too many numbers of multimode of lateral mode. Thus, it becomes difficult to lock the oscillation wavelength to the reflection wavelength of the reflector 2. For the above reasons, the stripe width of the semiconductor laser 1 is preferably equal to or longer than 10 µm and equal to or shorter than 200 µm.

As described above, the reflectance of the reflector 2 is preferably equal to or higher than 1% and equal to or lower than 10%. In this evaluation, the oscillation wavelength of the semiconductor laser 1 could not be locked by the reflection wavelength of the reflector 2, oscillation occurred only at the gain peak wavelength and the effect of spreading the oscillation spectrum could not be obtained when the reflectance was equal to or below 1%. On the other hand, when the reflectance was increased to or above 10%, the output loss of the semiconductor laser 1 increased, thereby causing a problem of reducing output utilization efficiency.

In the case of spreading the oscillation spectrum of the semiconductor laser 1 with the locked oscillation wavelength by the modulation as described above, a wavelength difference between the gain peak wavelength of the semiconductor laser 1 and the oscillation wavelength of the reflector 2 is important. Normally, an optimal wavelength difference largely varies depending on the structure of the semiconductor laser 1 and the reflectance of the reflector 2, but the wavelength difference is preferably at least equal to or longer than 5 nm and equal to or shorter than 20 nm. This is because the oscillation spectrum does not vary if the wavelength difference is equal to or below 5 nm and oscillation starts at the gain peak wavelength without being locked at the reflection wavelength if the wavelength difference is equal to or above 20 nm. Thus, even in this case, the oscillation spectrum does not vary.

In this way, the wavelength difference between the gain peak wavelength of the semiconductor laser 1 and the oscillation wavelength of the reflector 2 needs to be adjusted to an optimal value at which the spectrum varies by the modulation. The result of the investigation on the temperature adjustment of the semiconductor laser 1 for the purpose of adjusting this wavelength difference is described below.

Figure 9A:
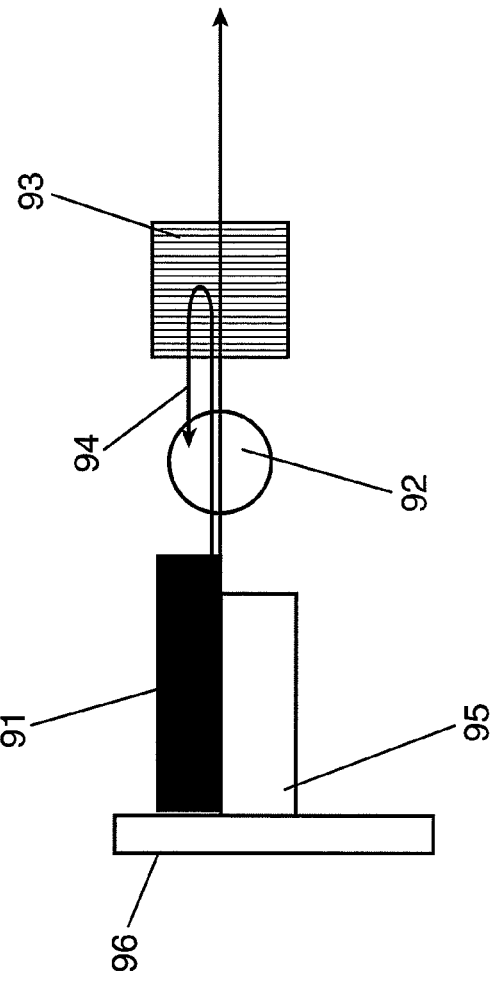
FIG. 9A is a diagram showing a construction of a light source used for the investigation of a wavelength difference between a gain peak wavelength of the semiconductor laser and the oscillation wavelength of the reflector of the illumination light source according to the first embodiment of the invention.

FIG. 9A shows a construction of an illumination light source used in this investigation. The illumination light source used in this evaluation is provided with a semiconductor laser 91, a reflector 93 for reflecting a part of an emitted light from the semiconductor laser 91, a lens 92 arranged between the semiconductor laser 91 and the reflector 93, a holder 95 for holding the semiconductor laser 91 and a temperature controller 96 arranged in the holder 95 for controlling the temperature of the semiconductor laser 91 as a basic construction. An experiment on an oscillation wavelength change in relation to a temperature change of the semiconductor laser 91 was conducted using the illumination light source of FIG. 9A and a change of the oscillation spectrum of the semiconductor laser 91 was observed.

Figure 9D:
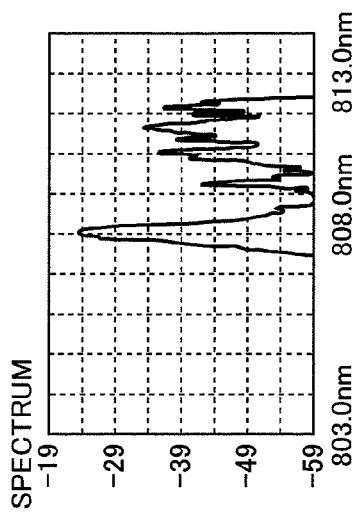
FIGS. 9B and 9D are graphs showing observation results on the oscillation spectra of the semiconductor laser.
Figure 9C:
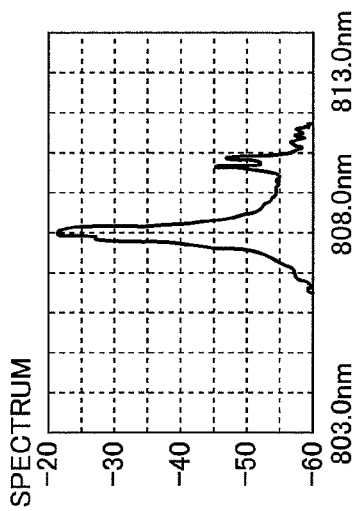
Figure 9B:
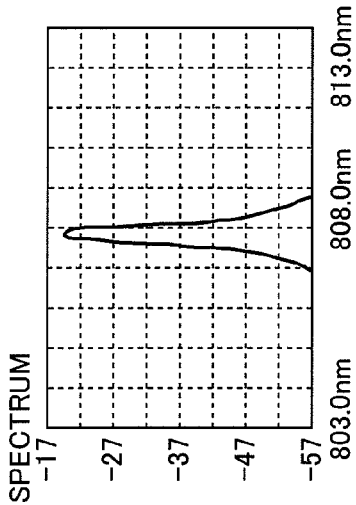

Here, a laser with a stripe width of 100 µm was used as the semiconductor laser 91 to lock the oscillation wavelength in the neighborhood of a reflection wavelength of 808 nm of the reflector 93. The temperature of the semiconductor laser 91 was changed by the temperature controller 96 and the change of the oscillation spectrum resulting from this temperature change was observed. The observation result is shown in FIGS. 9B to 9D. FIG. 9B shows a case where the temperature of the semiconductor laser 91 was set at 25° C., FIG. 9C shows a case where it was set at 30° C. and FIG. 9D shows a case where it was set at 40° C. In the case of 25° C. shown in FIG. 9B, the semiconductor laser 91 oscillates at the reflection wavelength of the reflector 93 since there is no difference between the reflection wavelength of the reflector 93 and the gain peak wavelength of the semiconductor laser 91. In the case of 30° C. shown in FIG. 9C, the gain peak is shifted toward a long wavelength side as the temperature of the semiconductor laser 91 increases. Thus, there is a difference between the reflection wavelength of the reflector 93 and the gain peak wavelength of the semiconductor laser 91 and oscillation starts in the neighborhood of the gain peak. In the case of 40° C. shown in FIG. 9D, the semiconductor laser 91 oscillates in the neighborhoods of both the gain peak wavelength and the reflection wavelength. As a result, the oscillation spectrum of the semiconductor laser 91 largely spreads to drastically reduce speckle noise.

From the above result, it could be verified that the spectrum could be spread at the time of modulation by setting the difference between the gain peak wavelength of the semiconductor laser 91 and the reflection wavelength of the reflector 93 to an optical value through the temperature adjustment of the semiconductor laser 91. Accordingly, the spread of the spectrum by the modulation can be maximally adjusted by adding a function of adjusting the temperature of the semiconductor laser 91.

Figure 10B:
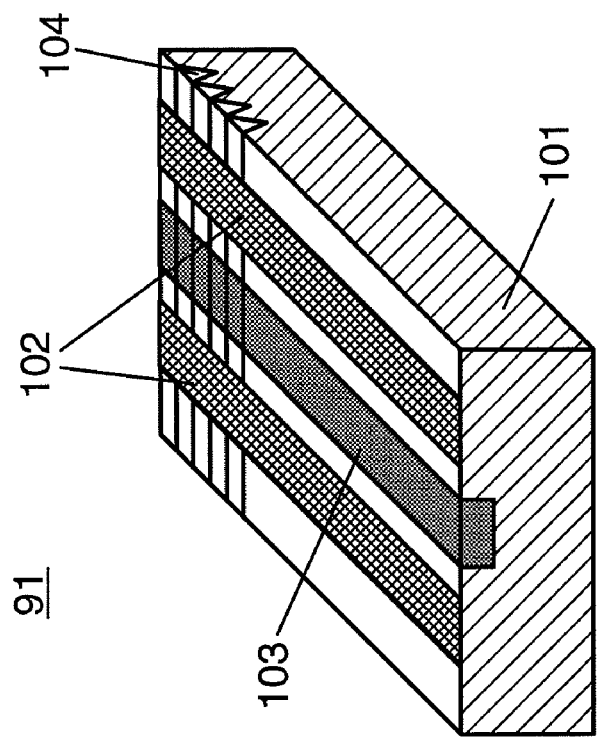
FIG. 10B is a diagram showing another construction of the temperature-adjustable semiconductor laser.
Figure 10A:
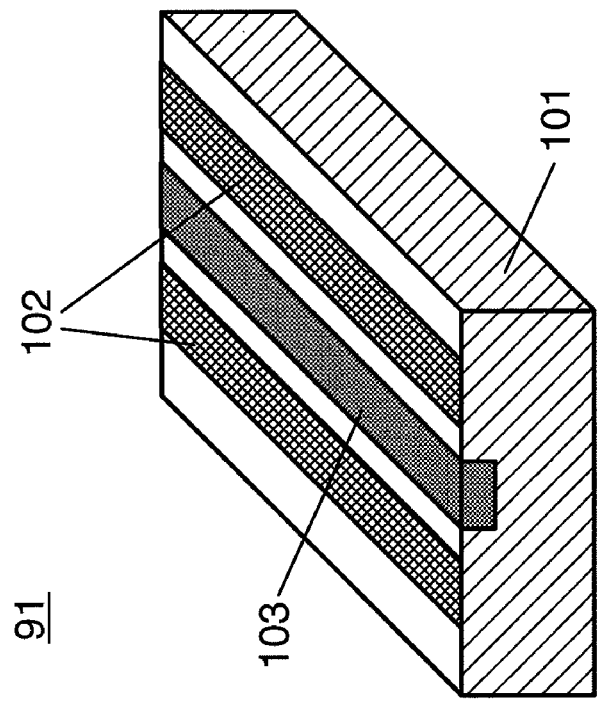
FIG. 10A is a diagram showing a construction of a temperature-adjustable semiconductor laser.

FIG. 10A shows a construction example of the temperature-adjustable semiconductor laser 91. The semiconductor laser 91 shown in FIG. 10A is provided with an active layer 103 formed on a substrate 101 and thin film heaters 102 arranged at the opposite sides of the active layer 103. The thin film heaters 102 are connected with the temperature controller 96 of FIG. 9A to be controlled by the temperature controller 96. By optimizing the temperature of the semiconductor laser 91 by the thin film heaters 102, the optimal wavelength difference shown in FIG. 9D can be set. Thus, the spectrum can be easily spread by controlling the wavelength difference between the gain peak wavelength of the semiconductor laser 91 and the reflection wavelength of the reflector 93.

FIG. 10B shows another construction example of the temperature-adjustable semiconductor laser 91. The semiconductor laser 91 shown in FIG. 10B is provided with an active layer 103 formed on a substrate 101, thin film heaters 102 arranged at the opposite sides of the active layer 103 and a diffraction grating 104 formed as the reflector. In this construction, the light source can be miniaturized by forming the reflector in the form of the diffraction grating 104 in the semiconductor laser 91. As shown in FIG. 10B, the diffraction grating 104 is formed in a part of the active layer 103. The oscillation wavelength of the semiconductor laser is fixed by Bragg reflection of the diffraction grating 104. The stripe width of the semiconductor laser 91 is 100 µm, and outputs are increased and wavelength fixation by the diffraction grating 104 is weakened by multimoding the lateral mode. In this way, spectrum variation by the modulation becomes easier. By modulating the output of this semiconductor laser 91, the spectrum can vary between the reflection wavelength of the diffraction grating 104 and the gain peak wavelength of the active layer 103 to reduce speckle noise. In the case of varying the spectrum by the modulation, a temperature control by the thin film heaters 102 is important to optimize the wavelength difference between the gain peak wavelength and the reflection wavelength of the diffraction grating 104. The spectrum variation can be adjusted to an optimal state by controlling the temperature. Further, in order to reduce power consumption, power applied to the thin film heaters 102 is preferably modulated in accordance with the output modulation. The power consumption of the thin film heaters 102 can be reduced by controlling a drive current for the thin film heaters 102 in accordance with the modulation of the semiconductor laser so that the temperature of the semiconductor laser 91 increases when the spectrum shifts to the gain peak of the semiconductor laser 91. The thin film heaters 102 formed in the semiconductor laser 91 are capable of high-speed response and can follow a modulation speed. The temperature of the semiconductor laser 91 itself can be controlled not only by the thin film heaters 102, but also by a method for modulating the refractive index of the semiconductor laser utilizing a plasma effect or by forming electrodes instead of the thin film heaters 102 and applying a current to the substrate 101 itself.

Further, a DFB laser, a DBR laser and the like formed with a periodic structure having a narrow band reflection characteristic in a semiconductor laser can be similarly used as the construction formed with the reflector in the semiconductor laser. Normally, in the DFB laser and the DBR laser, a coupling coefficient of a reflection wavelength by a grating and the wavelength of an excitation light in an active layer is increased so that an oscillation wavelength does not deviate from a wavelength selected by the grating. However, in this embodiment, the coupling coefficient needs to be reduced to or below half the normal value. In the construction of the present invention, the oscillation wavelength of the semiconductor laser needs to be deviated from the locked wavelength by the pulse drive. Thus, the coupling to such an extent as to shift the oscillation wavelength of the semiconductor laser from the locked wavelength by the grating by the pulse drive needs to be realized. In other words, the DFB laser and the DBR laser preferably oscillate at the Bragg wavelength of the grating near 50% of the maximum output of the semiconductor laser and oscillate at a wavelength other than the Bragg wavelength of the grating in CW oscillation near the maximum output. By using such DFB laser and DBR laser, the construction of a very small illumination light source can be realized. By pulse-driving the semiconductor laser, oscillation occurs at the reflection wavelength of the grating and another wavelength, whereby laser oscillation becomes possible in a wide wavelength region and a light source with little speckle noise can be realized. A multi-stripe structure with a DFB or DBR structure is more effective in increasing outputs and is also effective for a construction in which a supersaturated absorber used for self-oscillation is arranged near an active layer. Since the supersaturated absorber has a larger refractive index change by laser oscillation than a normal medium, the oscillation wavelength of the semiconductor laser largely changes and the spectrum width can be more widened.

Particularly, in the case of using a DBR laser, a grating structure is preferably formed in an active layer. The grating of the DBR laser is formed in an inactivated part of a waveguide to suppress a wavelength change by a temperature change. On the contrary, in this embodiment, the grating is directly formed in the active layer or on the outer surface of the active layer. The temperature of the active layer increases by current injection to change the refractive index, whereby the reflection wavelength of the DBR part shifts. If this property is utilized, the reflection wavelength changes by a temperature change resulting from pulse generation and the spectrum width can be widened. As a result, the suppression of the speckle noise can be achieved.

Next, the constructions of the above DFB laser and DBR laser are specifically described with reference to FIGS. 11A and 11B. FIG. 11A is a section showing the structure of the DBR laser, and FIG. 11B is a section showing the structure of the DFB laser. As descried above, the DFB laser and DBR laser can each include the diffraction grating integrated as the reflector by forming the diffraction grating (grating) in the laser. The oscillation wavelength of the semiconductor laser is fixed at the reflection wavelength of the diffraction grating by integrating the diffraction grating, and the speckle noise is reduced by varying the spectrum by the modulation. The stripe width of the semiconductor laser is 100 µm, outputs are increased and wavelength fixation by the diffraction grating is weakened by multimoding the lateral mode. Thus, the spectrum can be more easily varied by the modulation. The stripe width is preferably 10 to 200 µm. A very small illumination light source can be realized by integrating the diffraction grating.

At first, the construction of the DBR laser is described with reference to FIG. 11A. In the DBR laser shown in FIG. 11A, laser oscillation occurs by an active layer 115, a laser light 111 is outputted from an end surface 117 after having the intensity thereof controlled by current injection from an output control electrode 112. A specific wavelength is Bragg reflected by a diffraction grating 114 formed at a side near the end surface 116 of the active layer 115, and the oscillation wavelength of the semiconductor laser is fixed by this wavelength. A wavelength adjusting electrode 113 is formed above the diffraction grating 114, and the oscillation wavelength is controlled by changing the temperature of the diffraction grating 114 by current injection. A difference between the reflection wavelength of the diffraction grating 114 and a gain wavelength is increased by modulating an injection current into the output controlling electrode 112 to module the output and increasing the temperature of the active layer 115 to change the gain wavelength, whereby the oscillation spectrum can be varied between the reflection wavelength of the diffraction grating 114 and the gain peak wavelength. In this way, the oscillation spectrum of the semiconductor laser can be varied to reduce the speckle noise.

By varying the oscillation spectrum of the laser between the reflection wavelength of the diffraction grating 114 and the gain peak wavelength of the active layer 115 by the output modulation, the oscillation spectrum can be spread. Optimal values of the gain peak wavelength and the reflection wavelength can be controlled by the current injected into the wavelength adjusting electrode 113. Accordingly, a spectrum variation range can be adjusted by the wavelength adjusting electrode 113. Further, a current to the wavelength adjusting electrode 113 is preferably also modulated in accordance with the output modulation. By controlling the drive current for the wavelength adjusting electrode 113 in accordance with the modulation of the semiconductor laser so that the temperature of the semiconductor laser increases when the spectrum shifts to the gain peak of the semiconductor laser, the variation amount of the spectrum can be increased. Thus, the speckle noise can be further reduced. There is also an advantage of being able to achieve lower power consumption by reducing the power consumption in the wavelength adjusting portion.

In the case of a normal DBR laser, reflection from an end surface 116 of a diffraction grating 114 is suppressed so that a resonator is constructed by the diffraction grating 114 and an end surface 117. Specifically, the reflection of the end surface is reduced, for example, by forming an antireflection film on the end surface 116 and bending the stripes of an active layer 115 near the end surface 116. On the contrary, in this embodiment, the oscillation spectrum can be varied by changing the oscillation of the semiconductor laser to a wavelength locked state in which a resonator is constructed by the end surface 117 and the diffraction grating 114 and a state in which laser resonance occurs between the end surfaces 116 and 117. Thus, a reflection film is formed on the end surface 116.

Next, the construction of the DFB laser is described with reference to FIG. 11B. In the DFB laser shown in FIG. 11B, the diffraction grating 114 is formed on the entire active layer 115. By modulating the current injected into the output controlling electrode 112, the oscillation spectrum can be varied and the speckle noise can be reduced. Further, by providing the mechanism for adjusting the temperature of the laser shown in FIGS. 10A and 10B, the variation of the oscillation spectrum can be adjusted to the optimal state.

The modulation frequency of the semiconductor laser is preferably 0.1 kHz to 1 MHz. If the spectrum of an illumination light source changes within 0.1 kHz or shorter as speckle noise recognizable by human eyes, the speckle noise reducing effect is weakened since the spectral change can be observed by the naked eye. The frequency needs to be increased to or above 0.1 kHz so that the spectral variation cannot be recognized by human. On the other hand, upon shifting the spectrum by a temperature change in the active layer of the semiconductor laser in the modulation of the semiconductor laser, the spectrum does not vary unless a temperature change difference in the active layer is large when the laser is switched on and off. If the frequency is equal to or higher than 1 MHz, the temperature change in the active layer cannot follow the output modulation due to the influence of the heat diffusion speed of the semiconductor laser. Thus, the spectrum cannot be shifted by the modulation. Therefore, the modulation speed is preferably equal to or lower than 1 MHz.

A duty ratio (pulse width/pulse interval) of the pulse for driving the semiconductor laser is preferably equal to or below 50%. By setting the duty ratio to or below 50%, a peak output of the pulse in response to an average power can be set to or above twofold. Since the temperature of the active layer can be largely changed in one pulse by decreasing the duty ratio to increase the peak output, a wavelength shift amount can be increased to further increase the speckle noise suppressing effect. More preferably, the duty ratio is set to or below 30% to further reduce the speckle noise.

Second Embodiment

Next, a second embodiment of the present invention is described. In the first embodiment, a laser light emitted from the semiconductor laser is directly utilized as the illumination light source of the projection device or the display device. On the contrary, in this embodiment, a laser light emitted from a solid-state laser medium by exciting the solid-state laser medium with a laser light from a semiconductor laser is utilized as an illumination light source.

Figure 12:
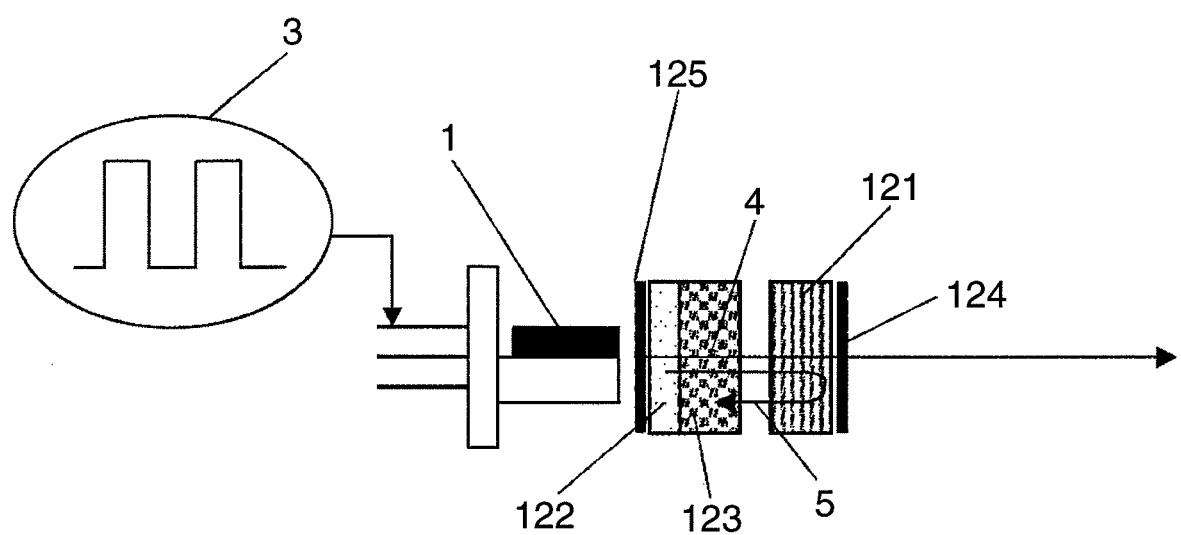
FIG. 12 is a diagram showing a construction of an illumination light source according to a second embodiment of the invention.

FIG. 12 shows a construction of the illumination light source according to this embodiment. The illumination light source shown in FIG. 12 is provided with a semiconductor laser 1, a reflector 121, a solid-state laser 122, a nonlinear optical element 123 and mirrors 124, 125. The semiconductor laser 1 is a pumping light source having a wavelength of 808 nm, and a light emitted from the semiconductor laser 1 excites the solid-state laser 122 to produce a laser oscillation. An emitted light 4 from the solid-state laser 122 produces a laser oscillation in a resonator structure constructed by the mirrors 124, 125. Since the reflector 121 formed by a volume grating arranged in the resonator feeds a selected wavelength back to the solid-state laser 122, the solid-state laser 122 is fixed to the reflection wavelength of the reflector 121. Nd:YVO$_4$ is used as a laser crystal and the oscillating laser light has a wavelength of 1064 nm. The nonlinear optical element 123 is arranged in the resonator. The nonlinear optical element 123 is Mg-doped LiNbO$_3$ having a periodic poled structure. The emitted light 4 generated in the resonator is converted into a second harmonic by the nonlinear optical element 123 to generate a green light having a wavelength of 532 nm. In this construction, the semiconductor laser 1 is pulse-driven by a driving power supply 3 for pumping the semiconductor laser 1.

In this construction, the reflection wavelength of the reflector 121 is set to, for example, about 1063 nm. If an Nd doped amount of the solid-state laser 122 was increased to about 3 at %, a gain wavelength region of the laser oscillation spread and a high oscillation intensity could be obtained even at 1063 nm. The output of the solid-state laser 122 is modulated by modulating the intensity of the semiconductor laser 1. When modulation was carried out with the modulation frequency set at 1 kHz and the on/off duty ratio of the pulse set at 25%, the output of the solid-state laser 122 is similarly modulated. By changing the temperature of the solid-state laser 122 by pulse excitation, the wavelength was changed from the initial oscillation wavelength of 1063 nm to about 1064.5 nm. This is a wavelength variation caused by a change of the oscillation wavelength from the reflection wavelength of the reflector 121 to another wavelength due to a temperature change of the solid-state laser 122. By this operation, the spectrum of a green SHG light to be outputted could be spread to a wavelength of 531.5 to 532.3 nm and speckle noise could be reduced. Further, by optimizing the doped amount of the solid-state laser 122, the gain wavelength region of the laser oscillation further spreads, with the result that the spectrum of the green SHG light could be spread to the wavelength of 531.5 to 532.3 nm.

In FIG. 12, the volume grating 121 as the reflector having a narrow band characteristic is arranged in the laser resonator formed by the mirrors 124, 125, but the oscillation wavelength of the laser can be also controlled by the optical feedback to the laser resonator from the outside of the laser resonator. Since a loss in the resonator can be reduced by the feedback of the wavelength from the outside, it is advantageous in increasing efficiency. In the method for the feedback of the reflection wavelength in the narrow band from the outside of the resonator, it is also possible to use the narrow band filter shown in FIG. 6 or to use the fiber grating shown in FIG. 7.

It is also effective to form a grating structure in the solid-state laser 122 itself. By partially distributing a doped amount of Nd or the like using a ceramic laser, a periodic refractive index distribution can be formed in a laser medium. In this way, the DFB structure of the solid-state laser 122 is realized. If this is excited by a pulsed light, the reflection wavelength region of the grating deviates from the gain wavelength region since the refractive index variation of the solid-state laser is large, wherefore the spectrum can be similarly spread by the wavelength variation.

It is also possible to use a reflector having a plurality of reflection wavelengths as the reflector having a narrow band characteristic. Further, by superimposing a high frequency wave on the output modulation of the semiconductor laser to make the oscillation of the solid-state laser unstable and to extend the spread of the spectrum, an effect of further reducing the speckle noise can be obtained.

It is also possible to use a fiber laser as the laser medium instead of the solid-state laser.

Third Embodiment

Next, a third embodiment of the present invention is described. In this embodiment, a drive current is modulated to largely vary an oscillation spectrum of a semiconductor laser by superimposing a high frequency wave on a drive current to be applied to the semiconductor laser.

Figure 13A:
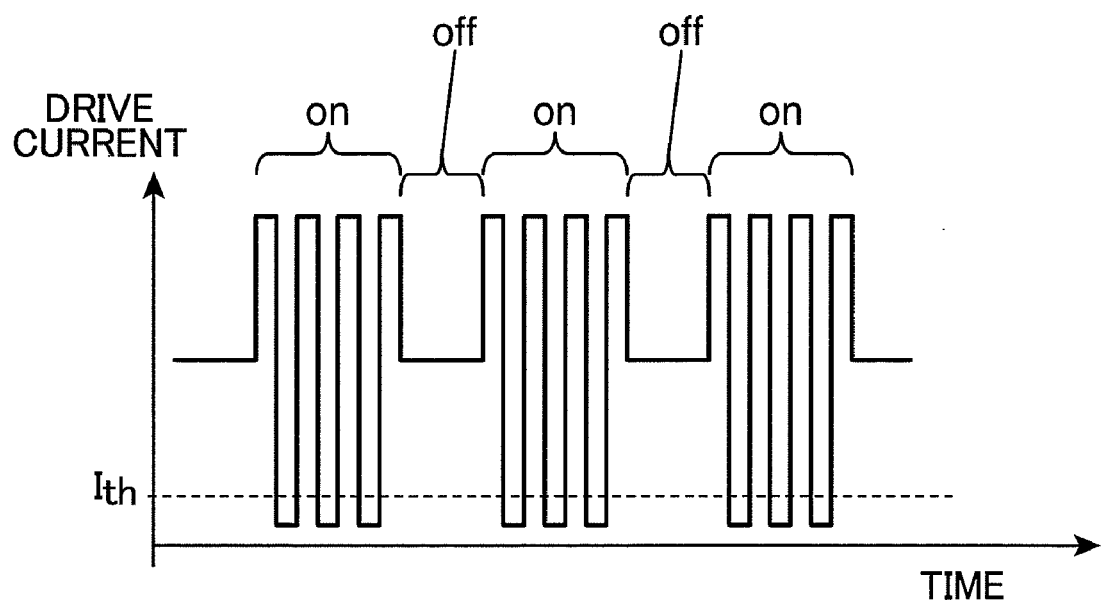
Figure 13B:
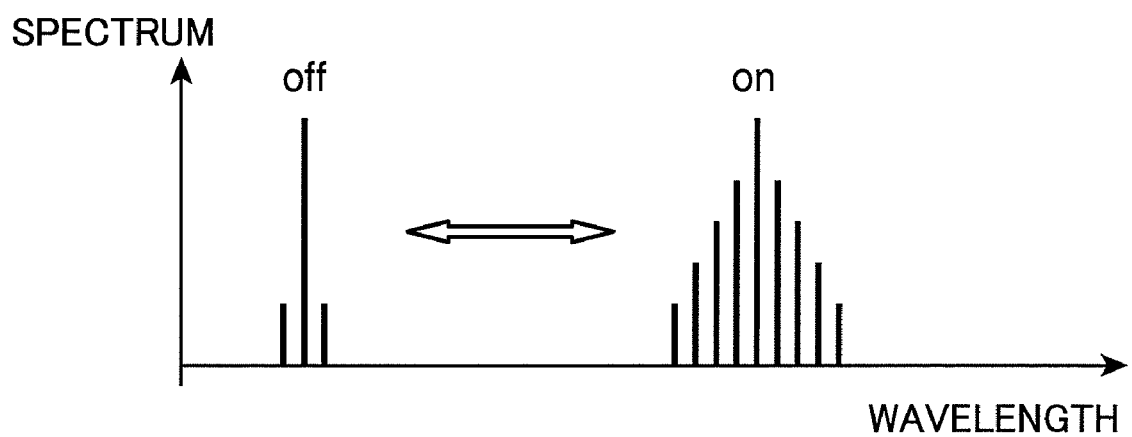

FIGS. 13A and 13B are graphs showing a method for driving a semiconductor laser of an illumination light source according to this embodiment, wherein FIG. 13A shows the waveform of a current, in which a high frequency wave is superimposed on a drive current for the semiconductor laser wavelength-locked by optical feedback, and FIG. 13B shows the oscillation spectrum of the semiconductor laser, to which a drive current with the current waveform of FIG. 13A is applied. In FIGS. 13A and 13B, "on" indicates a period during which the high frequency wave is superimposed on the drive current and "off" indicates a period during which no high frequency wave is superimposed on the drive current.

The coherence of the output light of the semiconductor laser decreases by superimposing the high frequency wave on the drive current for the semiconductor laser. The semiconductor laser utilizing the optical feedback can fix an output wavelength by the feedback of a light of a specific wavelength to the active layer from the outside. On the contrary, since the coherence of the light decreases if the high frequency wave is superimposed on the drive current for the semiconductor laser, correlation with the return light fed back from the outside decreases to release an optical lock. By providing the periods during which the high frequency wave is superimposed and not superimposed on the drive current, the spectrum can be temporally changed between a spectrum in which the oscillation wavelength of the semiconductor laser is fixed to the wavelength of the return light from the outside ("off" period in FIG. 13) and a state where the wavelength lock by the return light from the outside is released ("on" period in FIG. 13). In this way, the oscillation wavelength of the laser light can be temporally changed to drastically reduce the speckle noise observed by human. The frequency of the high frequency wave to be superimposed to reduce the coherence of the semiconductor laser needs to be equal to or higher than 10 MHz. A frequency of switching the application of the high frequency wave has needed to be 1 kHz or higher for the recognition by human that the speckle noise is reduced by the spectral change.

In the case of superimposing the high frequency wave, a minimum value of the drive current is preferably smaller than the value of a threshold current Ith of the semiconductor laser. By modulating the drive current from a value equal to or below the threshold current Ith, the coherence of the semiconductor laser is drastically reduced and the wavelength locking of the semiconductor laser becomes easier to release.

The semiconductor laser is preferably a wide stripe laser whose lateral mode is a multimode oscillation. Since a single-mode semiconductor laser is easily wavelength-locked and the wavelength locking is difficult to release even if a high frequency wave is superimposed, a high frequency wave with a very high amplitude needs to be superimposed. Since the wavelength locking is easily released in the wide stripe laser, the power consumption in the superimposition of the high frequency wave can be reduced.

Further, by the superimposition of the high frequency wave, a single spectrum itself can be spread as shown in the "on" period of FIG. 13B. Therefore, the coherence can be further reduced and the speckle noise can be further reduced.

Figure 14A:
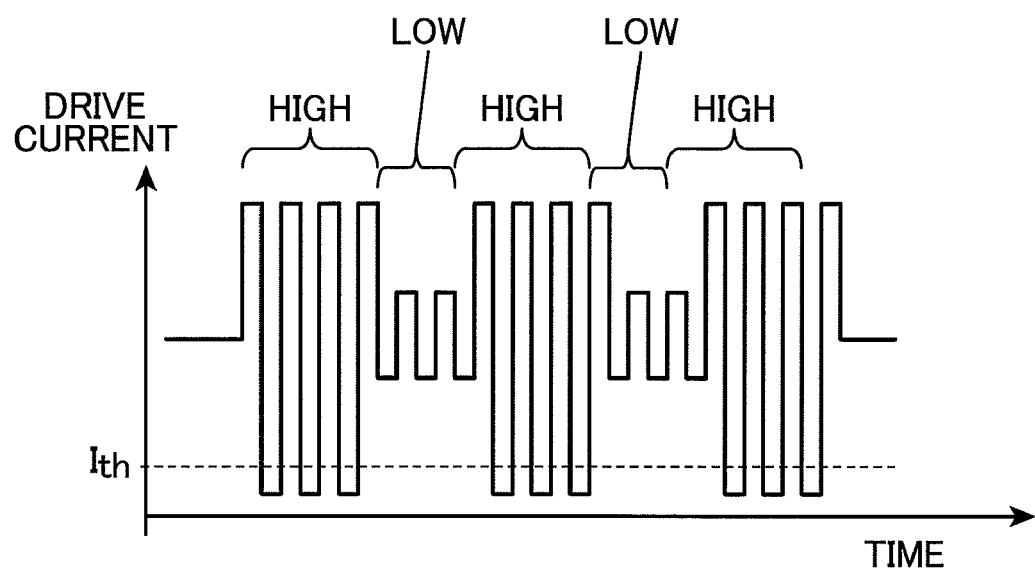
Figure 14B:
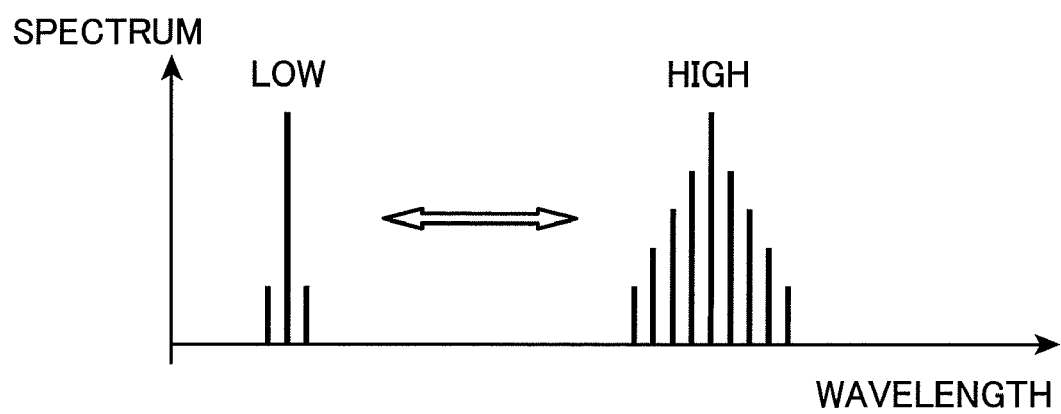

FIGS. 14A and 14B are graphs showing another method for driving the semiconductor laser of the illumination light source according to this embodiment, wherein FIG. 14A shows the waveform of a current, in which a high frequency wave is superimposed on a drive current for the semiconductor laser wavelength-locked by optical feedback, and FIG. 14B shows the oscillation spectrum of the semiconductor laser, to which a drive current with the current waveform of FIG. 14A is applied. In FIGS. 14A and 14B, "high" indicates a period during which a high frequency wave of high intensity is superimposed on the drive current and "low" indicates a period during which a high frequency wave of low intensity is superimposed on the drive current. As shown in FIG. 14B, the semiconductor laser can be oscillated by two spectra similar to FIGS. 13A and 13B by temporally modulating the amplitude intensity of the high frequency wave.

Figure 15A:
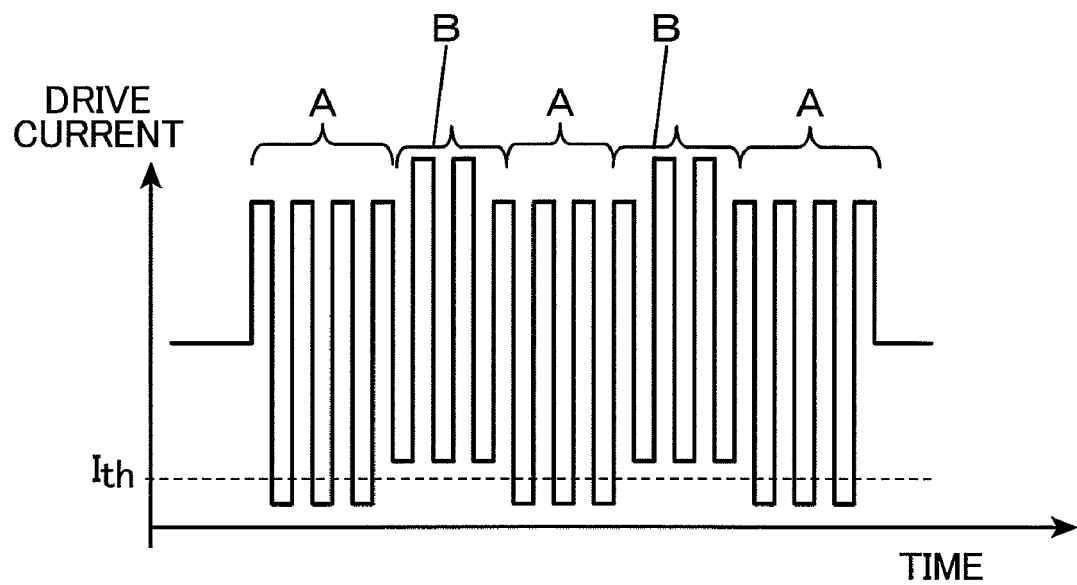
Figure 15B:
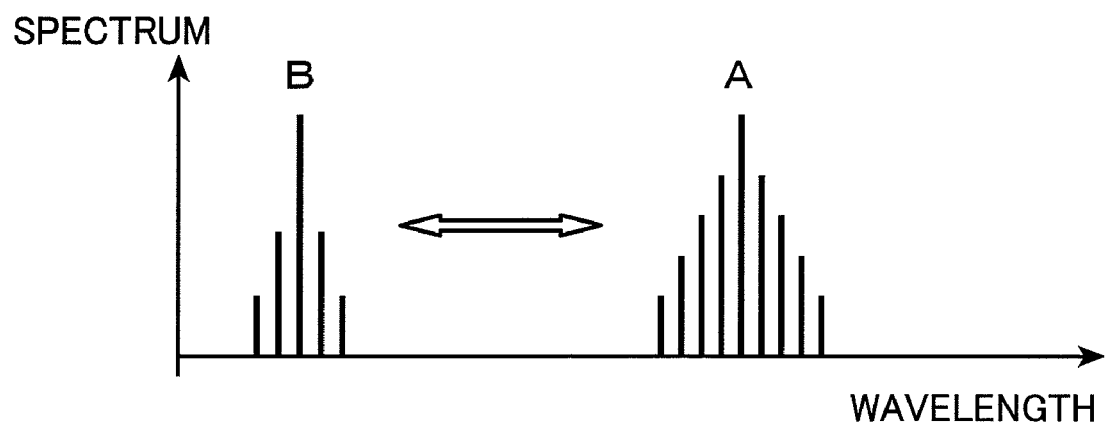

FIGS. 15A and 15B are graphs showing still another method for driving the semiconductor laser of the illumination light source according to this embodiment, wherein FIG. 15A shows the waveform of a current, in which a high frequency wave is superimposed on a drive current for the semiconductor laser wavelength-locked by optical feedback, and FIG. 15B shows the oscillation spectrum of the semiconductor laser, to which a drive current with the current waveform of FIG. 15A is applied. In FIGS. 15A and 15B, "A" indicates a period during which a minimum value of the drive current is below the threshold current Ith and "B" indicates a period during which the minimum value of the drive current is above the threshold current Ith. By this driving method, the semiconductor laser is driven such that the minimum value of the amplitude changes to exceed and fall below the threshold current Ith of the semiconductor laser by modulating the bias of the high frequency wave. If the minimum value of the drive current superimposed with the high frequency wave falls to or below the threshold current of the semiconductor laser, the coherence of the semiconductor laser is drastically reduced. Utilizing this phenomenon, the amplitude or bias of the superimposed high frequency wave is modulated such that the minimum value of the drive current changes to exceed and fall below the threshold current, whereby the oscillation spectrum of the semiconductor laser can be changed between two wavelengths. Since the high frequency wave is superimposed even in the wavelength locked state in this construction, the spread of the oscillation spectrum can be increased as shown in the "B" period of FIG. 15B. Therefore, a speckle noise reducing effect can be further strengthened.

It is also effective to modulate the frequency of the high frequency wave. In the case of fixing the wavelength by the optical feedback, there is a frequency, at which the high frequency wave is more easily applied, depending on a distance between the reflector and the semiconductor laser. This is determined by a feedback time of a reflected light by the reflector to the semiconductor laser. Thus, the intensity of the wavelength locking can be changed even by temporally changing the frequency of the high frequency wave. In other words, the oscillation spectrum is fixed at the wavelength fed back from the reflector outside at a frequency with the strong wavelength locking, and oscillation occurs at the gain peak of the semiconductor laser deviated from the wavelength fed back from the outside at a frequency with the weak wavelength locking. Therefore, the semiconductor laser can be oscillated to produce two wavelength spectra.

Although the semiconductor laser is a laser medium in this embodiment, a solid-state laser or a fiber laser may also be used as the laser medium. In the case of the solid-state laser or fiber laser, a high frequency wave is superimposed on a pumping semiconductor laser for exciting the laser medium. Further, in the case of the fiber laser, a fiber grating having a periodic refractive index distribution in a fiber is preferably used as the reflector for reflecting the specific wavelength. The oscillation spectrum of the solid-state laser or fiber laser can be temporally changed by driving the pumping semiconductor laser with a high frequency wave to modulate the frequency and amplitude of the high frequency wave. In this way, the spectrum of the laser light can be drastically reduced.

Although the reflector reflects the specific wavelength from the outside is arranged in the laser medium, a similar construction can be adopted for DFB lasers and DBR lasers formed with a grating structure in a laser medium, e.g. in a semiconductor laser.

Fourth Embodiment

Next, a fourth embodiment of the present invention is described. In this embodiment, a laser display is realized using the illumination light source according to the above first to third embodiments.

The laser display is a display device using RGB laser lights and requires a large output of several 100 mW to several W or higher. Since lights are not required to have a diffraction-limited focusing property in the case of a laser display, the lateral mode of the semiconductor laser needs not be a single mode. Accordingly, a high-output semiconductor laser with a wide stripe structure is used. An AlGaAs semiconductor material or AlGaInP semiconductor material is used as a red laser, whose oscillation wavelength is 630 to 640 nm. A semiconductor laser having a GaN substrate as a base is used as a blue laser, whose oscillation wavelength is 440 to 450 nm. In order to realize a color display, RGB illumination is necessary. Here is used a field sequential method for displaying by switching RGB lights. A frequency is 60 Hz and emission times of blue, red and green lights are switched at 30%. Laser lights are converted into an image by using a DLP as a spatial modulation element. The RGB lights are successively switched by driving the RGB light sources at a frequency of 120 Hz and a duty ratio of 30%, and a color image is displayed by combining images of the respective colors.

A reflected light of a specific wavelength is fed back to each semiconductor laser by a grating. By pulse-driving the semiconductor laser at a peak output of 500 mW, an oscillation wavelength shifts from the reflection wavelength of the grating to another wavelength to be changed. It became possible to spread the spectra, to drastically reduce speckle noise and to achieve high-quality images by switchingly driving the RGB lasers. In this embodiment, the spectra of the light sources can be spread by the switching modulation of RGB images necessary for color display and the speckle noise can be reduced without necessitating a special construction.

Here, W-class laser light sources aimed to be applied to a laser display are described. In order to realize a large screen of 100-inch class by the illumination of lasers, outputs of several W are necessary as light source characteristics. In order to obtain a full color output, lasers having wavelength regions of red, blue and green need to be of several W class. However, it is difficult to obtain a W-class output in a semiconductor laser with a single stripe structure. Accordingly, there is proposed a construction for obtaining an output of several W utilizing a semiconductor laser with a multi-stripe structure. About ten stripes are integrated at a stripe width of 50 μm, a stripe interval of 300 μm and a chip width of 12 mm. An output per stripe is about several 100 mW, and an output of 4 W can be obtained from one chip. An oscillation wavelength is fixed by optical feedback to the respective stripes by a volume grating. By RGB switching this laser array to module the output, the oscillation wavelength changed and the spectral width increased, whereby the speckle noise was drastically reduced. By designing the oscillation wavelength of the grating to differ between the stripes, the spectrum of each light source could be further spread. Further, since the spectrum can be temporally changed and the spectral width can be further widened by pulse modulation, the speckle noise was further reduced.

It could be realized to increase outputs, improve yield and improve reliability by the wide stripe structure capable of easily increasing outputs.

Fifth Embodiment

Next, a fifth embodiment of the present invention is described. This embodiment relates to a laser projection device as one type of the laser display according to the fourth embodiment. The laser projection device is provided with RGB light sources and a projection optical system and can project a full color video by projecting lights from the laser light sources to a screen or the like by the projection optical system. Projection methods are divided into a type in which reflected lights are seen by projecting a video onto a projection member as an external screen, wall or the like and a rear-projection type in which reflected lights are seen by irradiating a screen with lights from behind. In either case, colors can be recognized by lights diffused by the screen or the like. However, in the case of utilizing lasers with high coherence, there occurs a problem that the lights diffused by the screen interfere to generate speckle noise. An effective method for reducing the speckle noise is to reduce the coherence of the laser lights. In order to reduce the coherence of the laser lights, it is effective to spread the oscillation spectrums of the lasers.

Figure 16:
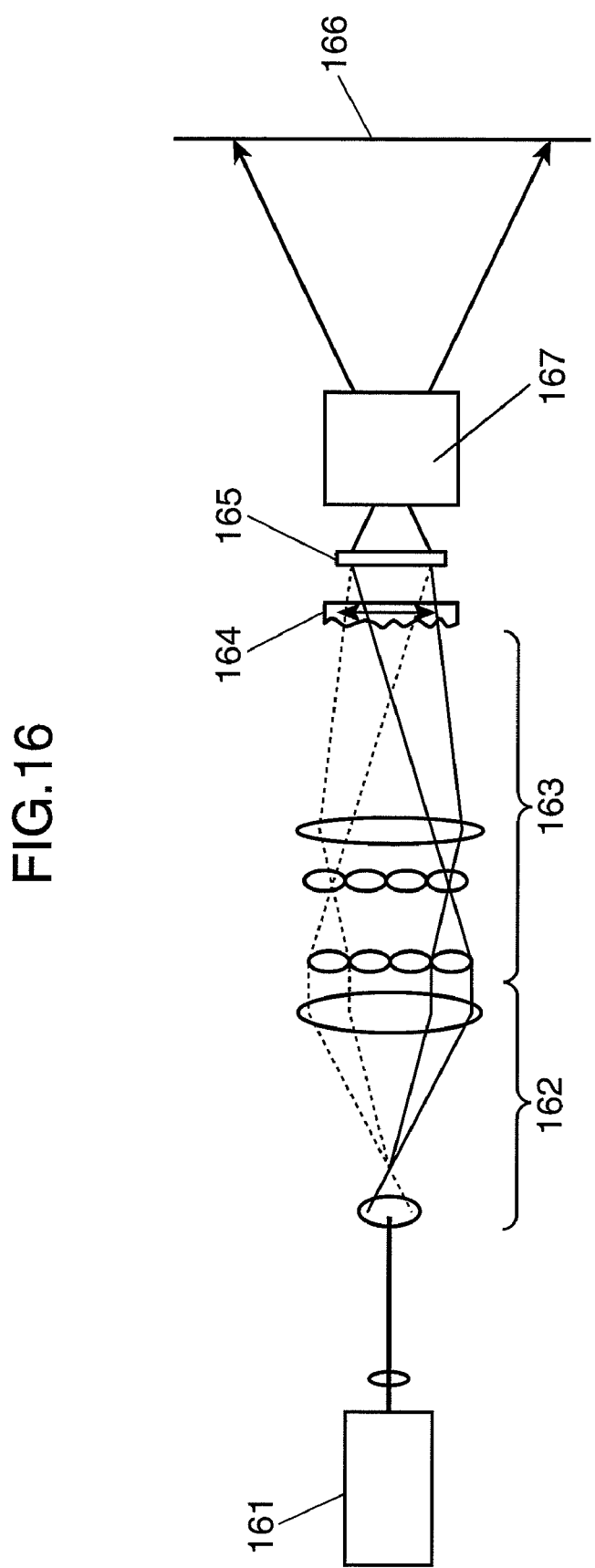
FIG. 16 is a diagram showing a construction of a laser projection device according to a fifth embodiment of the invention.

FIG. 16 is a diagram showing a construction of the laser projection device according to this embodiment. The laser projection device according to this embodiment is a laser display for converting a laser light into an image by a liquid crystal panel as a two-dimensional switch and projecting a video onto a screen using the illumination light source according to the above first to third embodiments. A light emitted from an illumination light source 161 is converted into an image by the liquid crystal panel 165 as a two-dimensional switch after passing through a diffuser plate 164 via a collimating optical system 162 and an integrator optical system 163, and projected onto a screen 166 by a projection lens 167. The diffuser plate 164 is displaceable by a pivoting mechanism to reduce the speckle noise generated on the screen 166 in cooperation with the spectrum spreading by the illumination light source 161.

In the laser projection device according to this embodiment, the speckle noise generated on the screen is reduced by reducing the coherence utilizing the wavelength variation of the illumination light source 161. The illumination light source 161 could provide a stable output even upon an external temperature change, and a stable video could be realized by the small-size high-output illumination light source. Further, it became possible to easily design, miniaturize and simplify the optical systems for higher beam quality.

By using a plurality of illumination light sources according to the above first to third embodiments, the speckle noise can be further reduced. By setting the wavelengths of the reflectors of the respective light sources to different wavelengths using the plurality of illumination light sources, the oscillation spectra of the illumination light sources largely spread as a whole, wherefore the speckle noise can be drastically reduced.

Besides the liquid crystal panel, a reflective liquid crystal switch, a DMD mirror and the like can also be used as the two-dimensional switch.

Sixth Embodiment

Next, a sixth embodiment of the present invention is described. This embodiment relates to another laser projection device according to one type of the laser display according to the fourth embodiment.

Figure 17:
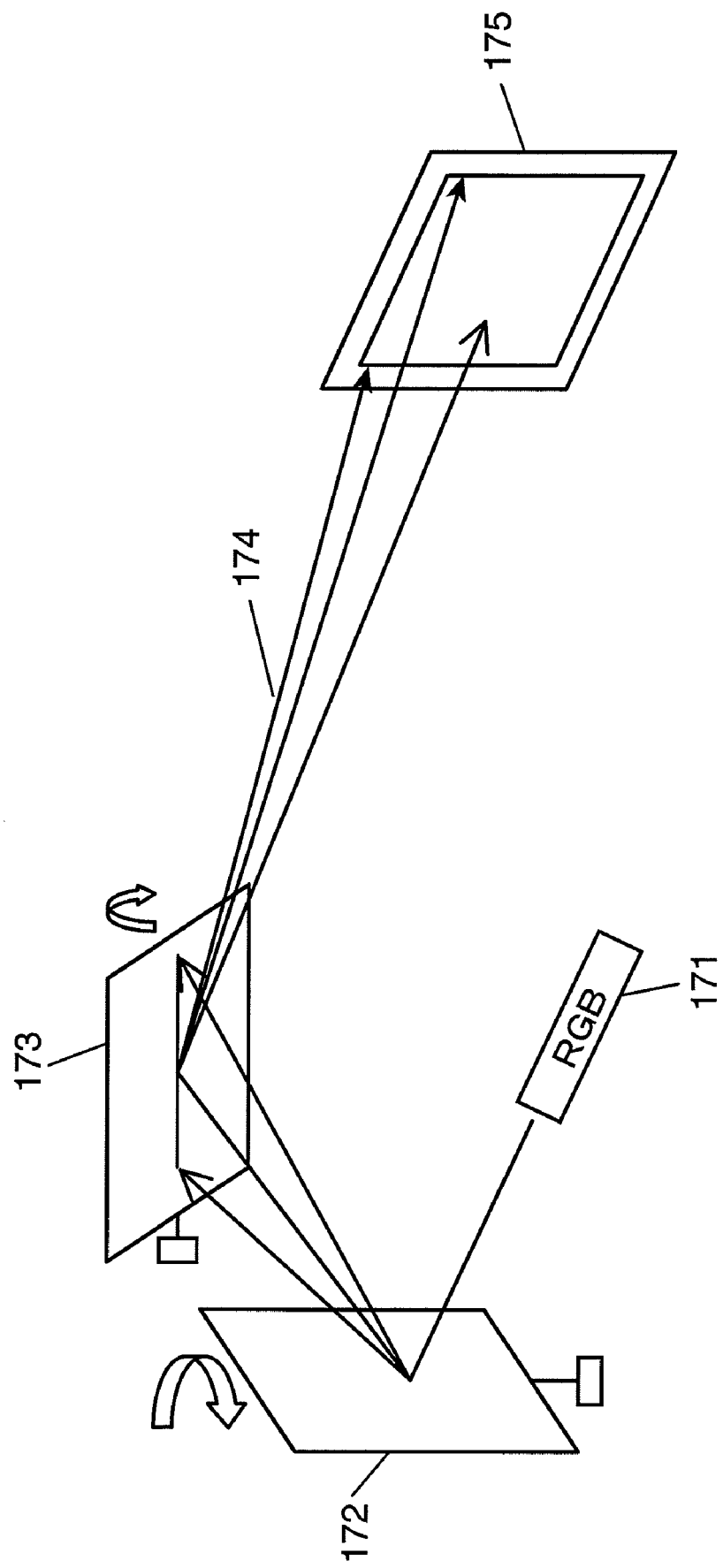
FIG. 17 is a diagram showing a construction of a laser projection device according to a sixth embodiment of the invention.

FIG. 17 is a diagram showing a construction of the laser projection device according to this embodiment. A laser light 174 emitted from an illumination light source 171 displays a two-dimensional image on a screen 175 by being scanned by mirrors 172, 173. In this case, the illumination light source 171 needs to have a high-speed switching function. The illumination light source 171 according to this embodiment can obtain stable outputs through a simple temperature control since being capable of obtaining higher outputs and stabilizing outputs. Since a spectrum can be simultaneously spread by modulating the outputs, there is an advantage of simultaneously achieving an output modulation for image formation and an output modulation for spreading the spectrum. Since speckle noise can be reduced by the output modulation for image formation, a construction necessary only for the reduction of the speckle noise becomes unnecessary. A small-size scanning device utilizing a MEMS can also be utilized as a beam scanning optical system. A high beam quality provides excellent focusing property and collimating property, and a micromirror such as a MEMS can also be utilized. Thus, a scan-type laser display could be realized.

Figure 18:
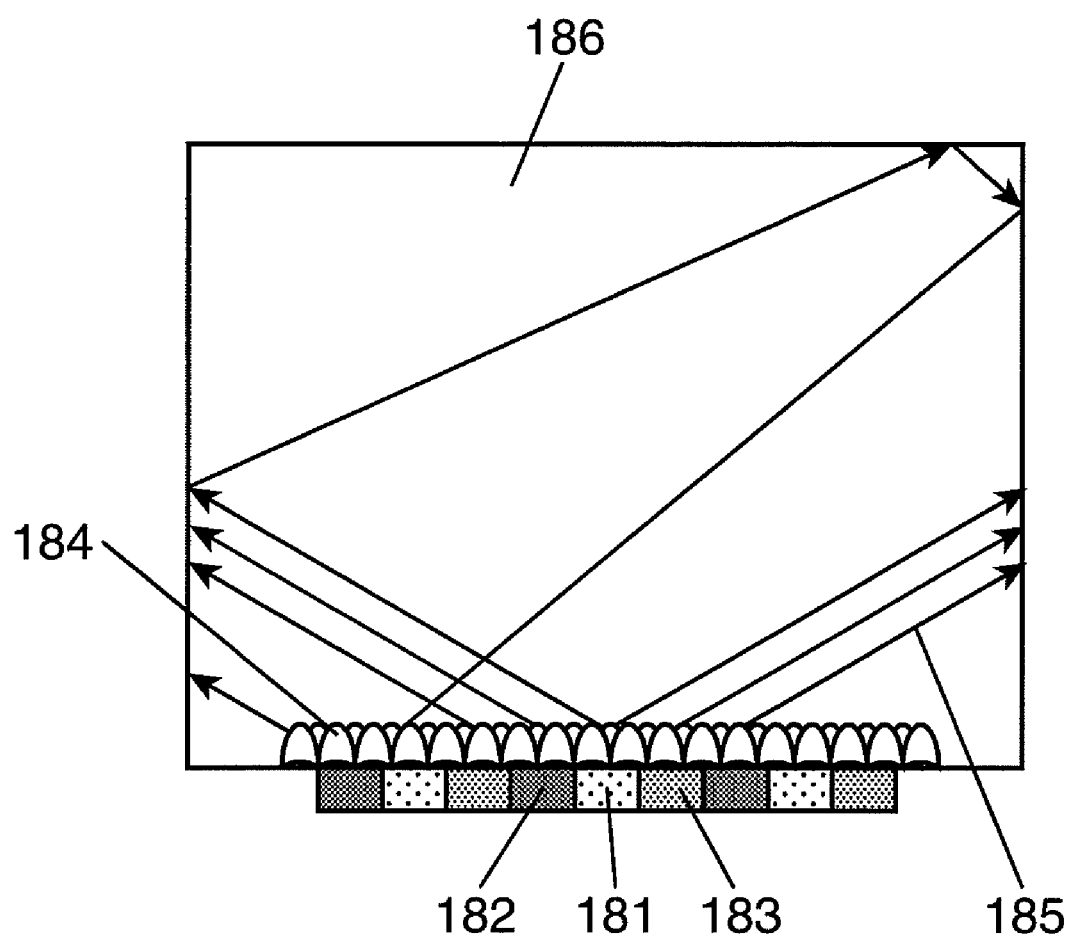
FIG. 18 is a diagram showing a construction of a liquid crystal backlight using the illumination light sources according to the first to third embodiments of the invention.

Although the laser display is described as the optical device in the above fourth to sixth embodiments, other applications to liquid crystal backlights are also possible. If an illumination light source is used as a light source for a liquid crystal backlight, speckle noise is suppressed and high-quality images can be realized. Since colors in a wider range can be represented by laser lights, a display with good color reproducibility can be realized. FIG. 18 shows a construction of a liquid crystal backlight using illumination light sources according to the above first to third embodiments. Laser lights 185 from illumination light sources 181 to 183 are incident on an end surface of a light guiding plate 186 through a microlens 184 to form a planar backlight source. A spectrum is largely spread as a whole by using a plurality of laser light source to increase luminance and using a plurality of illumination light sources to set the wavelengths of reflectors of the respective light sources to different wavelengths. In this way, the speckle noise can be drastically reduced.

In the case where a laser light source is utilized as an illumination light source for laser illumination and the like, such a laser light source is useful as a light source with little speckle noise.

The illumination light source of the present invention largely varies the oscillation wavelength of the laser medium wavelength-locked by the optical feedback utilizing the variation of the gain wavelength region caused when the output of the laser medium is modulated. In this way, the variation range of the oscillation spectrum of the laser medium is widened to realize a light source with little speckle noise. An illumination optical device capable of providing high image quality with little speckle noise can be realized by an illumination optical system and a projection optical system using this light source.

The present invention is summarized as follows from the above respective embodiments. Specifically, an illumination light source according to the present invention comprises a laser light source having a laser medium with a specified gain region and a reflector having a narrow band reflection characteristic, wherein the reflection wavelength of the reflector is set in the gain region of the laser medium; a part of a laser light emitted from the laser light source is fed back to the laser light source by being reflected by the reflector; and the oscillation wavelength of the laser light source changes from the reflection wavelength by shifting a peak of the gain region of the laser medium from the reflection wavelength through a change of the oscillation characteristic of the laser light source.

In the above illumination light source, an oscillating light of the laser light source is fixed to the wavelength of the reflector by feeding the part of the laser light emitted from the laser light source back to the laser light source through the reflection of the reflector. By changing the oscillation characteristic of the laser light source, the peak of the gain region of the laser light source is shifted from the fixed reflection wavelength. Thus, the oscillation spectral width of the laser light source spreads to reduce coherence since the oscillation wavelength of the laser light source can be largely changed. Therefore, an illumination light source with little speckle noise can be realized.

The reflection wavelength of the reflector is preferably set shorter than the peak of the gain region of the laser medium.

In this case, by setting the reflection wavelength shorter, the variation of the oscillation wavelength of the laser light source can be made larger in the case of shifting the peak of the gain region of the laser light source toward a long wavelength side.

A variation amount of the oscillation wavelength of the laser light source is preferably 1 nm or longer.

In this case, the variation amount of the oscillation wavelength of the laser light source can be made larger than a shift range of the peak of the gain region of the laser light source.

It is preferable that the reflector has a plurality of reflection wavelengths; and that the oscillation wavelength of the laser light source is changed between the plurality of reflection wavelengths.

In this case, the variation amount of the oscillation wavelength can be increased since the oscillation wavelength of the laser light source can be changed between the plurality of reflection wavelengths.

It is preferable that the oscillation characteristic of the laser light source is changed by pulse-modulating a drive current to be applied to the laser light source; and that a duty ratio of the pulse of the pulse modulation is 50% or lower.

In this case, a change of the oscillation characteristic of the laser light source can be made larger since a peak output of the drive current in response to an average output can be increased.

The pulse width of the pulse modulation is preferably 1 μs or larger.

In this case, the oscillation characteristic of the laser light source can be so changed as to follow the pulse modulation of the drive current.

The pulse of the pulse modulation is preferably a combination of a plurality of short pulses.

In this case, the change of the oscillation characteristic of the laser light source can be made even larger.

The reflector preferably includes a dielectric element formed with a refractive index grating.

In this case, the illumination light source can be miniaturized since the dielectric element formed with the refractive index grating can be miniaturized.

The reflector preferably includes a fiber formed with a grating.

In this case, the reflector can be realized by a simple construction.

The reflector preferably includes a narrow band filter and a reflective member for reflecting a part of a light having passed though the narrow band filter.

In this case, the reflector can be realized by a simple construction.

The laser light source is preferably a semiconductor laser.

In this case, a high-luminance and high-output laser light source can be utilized.

The reflector is preferably formed in the semiconductor laser.

In this case, the illumination light source can be miniaturized.

The semiconductor laser is preferably made of a III-V nitride semiconductor material.

In this case, a high-luminance and high-output laser light source can be obtained.

The semiconductor laser is preferably made of an AlGaAs semiconductor material.

In this case, a high-luminance and high-output laser light source can be obtained.

The semiconductor laser is preferably made of an AlGaInP semiconductor material.

In this case, a high-luminance and high-output laser light source can be obtained.

It is preferable that the laser light source is a solid-state laser; and that the solid-state laser includes a solid-state laser medium, a resonator including the solid-state laser medium and a nonlinear optical element arranged in the resonator.

In this case, a laser light source of large power output can be obtained.

The laser light source is preferably a fiber laser.

In this case, a laser light can be obtained with high efficiency.

A high frequency wave signal for modulating at least one of the frequency, amplitude and bias of the drive current is preferably superimposed on the drive current.

In this case, the oscillation wavelength of the laser light source fixed to the reflection wavelength can be easily varied since the coherence of the laser light source emitted from the laser light source can be reduced.

It is preferable that the frequency of the high frequency wave signal is 10 MHz or higher, and it is preferable that the frequency of a modulation signal for modulating at least one of the frequency, amplitude and bias of the high frequency wave signal is 1 kHz or higher.

An observer can be let to sense a speckle noise reducing effect while the coherence of the laser light emitted from the laser light source is reduced.

The minimum value of the drive current preferably changes to exceed and fall below a threshold current value of the laser light source.

In this case, the oscillation wavelength can have a spread even in a state where the oscillation wavelength of the laser light source is fixed to the reflection wavelength.

It is preferable that the semiconductor laser includes a heater for heating the semiconductor laser, and for heating by heat generated from the heater is so controlled as to follow a change of the oscillation characteristic of the semiconductor laser.

In this case, the oscillation characteristic of the semiconductor laser can be changed in an optimal state.

It is preferable that (i) the reflector includes a diffraction grating, (ii) the reflection wavelength is set by Bragg reflection by the diffraction grating, (iii) the semiconductor laser further includes an output controlling electrode, to which the drive current is supplied and which can control the output of the semiconductor laser, and a wavelength controlling electrode, to which a wavelength controlling current is supplied and which can control the oscillation wavelength of the semiconductor laser through a temperature control of the diffraction grating by the injection of the wavelength controlling current, and (iv) the wavelength controlling current is so pulse-modulated as to follow the pulse modulation of the drive current.

In this case, the variation amount of the oscillation wavelength of the semiconductor laser can be increased by pulse-modulating the wavelength controlling current in such a manner as to follow the pulse modulation of the drive current.

The reflectance of the reflector is preferably 1 to 10%.

In this case, a change from the fixed reflection wavelength can be easily made while the oscillation wavelength of the laser light source is fixed at the reflection wavelength.

A narrow band width of the reflector is preferably 5 nm or shorter.

In this case, the oscillation wavelength of the laser light source can be easily fixed at the reflection wavelength.

A laser projection device according to the present invention comprises at least one of the above illumination light sources, and an optical system for projecting a laser light emitted from the illumination light source.

The above laser projection device can project a good video having speckle noise effectively suppressed.

A lateral mode of the laser light emitted from the laser light source is preferably a multimode.

In this case, the output of the laser light emitted from the laser light source can be increased.

The wavelength interval of a vertical mode of the laser light emitted from the laser light source is preferably 1 nm or longer.

In this case, a variation amount of the oscillation wavelength of the laser light source can be made larger than a shift range of the peak of a gain region of the laser light source.

The reflection wavelengths of the reflectors are preferably different from each other.

In this case, the speckle noise can be reduced since the oscillation spectrum of the entire illumination light source can be largely spread.

It is preferable to further comprise a light guiding plate, on which the laser light emitted from the illumination light source is incident.

In this case, the laser light can be irradiated uniformly over the entire screen.

The illumination light source according to the present invention is effective in reducing the speckle noise of a semiconductor laser by utilizing a gain shift by the optical feedback and the pulse drive to largely change the oscillation wavelength of the semiconductor laser. In the case of utilizing a semiconductor laser as the illumination light source, it is essential technology to reduce the speckle noise and the small-size and simple construction of the present invention is very effective as the illumination light source.

The invention claimed is:

1. An illumination light source, comprising:
a laser light source including a laser medium with a specified gain region; and a reflector including a narrow band reflection characteristic,
wherein a reflection wavelength of the reflector is set in the gain region of the laser medium,
wherein a part of a laser light emitted from the laser light source is reflected by the reflector and fed back to the laser light source, and
wherein an oscillation spectrum of the laser light source is spread by changing an oscillation wavelength of the laser light source from the reflection wavelength to a shifted peak of the gain region of the laser medium, the oscillation wavelength being changed by shifting the peak of the gain region from the reflection wavelength, and the peak of the gain region being shifted by changing an oscillation characteristic of the laser light source.

2. The illumination light source according to claim 1, wherein the reflection wavelength of the reflector is set to be shorter than the peak of the gain region of the laser medium.

3. The illumination light source according to claim 1, wherein a variation amount of the oscillation wavelength of the laser light source is 1 nm or longer.

4. The illumination light source according to claim 1, wherein:
the reflector has a plurality of reflection wavelengths; and
the oscillation wavelength of the laser light source changes between the reflection wavelengths of the plurality of reflection wavelengths.

5. The illumination light source according to claim 1, wherein:
the oscillation characteristic of the laser light source is changed by pulse-modulating a drive current applied to the laser light source; and
a duty ratio of a pulse of the pulse modulation is 50% or lower.

6. The illumination light source according to claim 5, wherein a pulse width of the pulse modulation is 1 µs or larger.

7. The illumination light source according to claim 5, wherein the pulse of the pulse modulation is a combination of a plurality of short pulses.

8. The illumination light source according to claim 1, wherein the reflector includes a dielectric element formed with a refractive index grating.

9. The illumination light source according to claim 1, wherein the reflector includes a fiber formed with a grating.

10. The illumination light source according to claim 1, wherein the reflector includes a narrow band filter and a reflective member for reflecting a part of a light having passed through the narrow band filter.

11. The illumination light source according to claim 5, wherein the laser light source is a semiconductor laser.

12. The illumination light source according to claim 11, wherein the reflector is formed in the semiconductor laser.

13. The illumination light source according to claim 11, wherein the semiconductor laser is made of a III-V nitride semiconductor material.

14. The illumination light source according to claim 11, wherein the semiconductor laser is made of an AlGaAs semiconductor material.

15. The illumination light source according to claim 11, wherein the semiconductor laser is made of an AlGaInP semiconductor material.

16. The illumination light source according to claim 5, wherein the laser light source is a solid-state laser.

17. The illumination light source according to claim 16, wherein the solid-state laser includes a solid-state laser medium, a resonator including the solid-state laser medium and a nonlinear optical element arranged in the resonator.

18. The illumination light source according to claim 5, wherein the laser light source is a fiber laser.

19. The illumination light source according to claim 5, wherein a high frequency wave signal for modulating at least one of a frequency, an amplitude, and a bias of the drive current is superimposed on the drive current.

20. The illumination light source according to claim 19, wherein:
a frequency of the high frequency wave signal is 10 MHz or higher; and
a frequency of a modulation signal for modulating at least one of the frequency, an amplitude, and a bias of the high frequency wave signal is 1 kHz or higher.

21. The illumination light source according to claim 19, wherein a minimum value of the drive current changes to exceed and fall below a threshold current value of the laser light source.

22. The illumination light source according to claim 12, wherein:
the semiconductor laser includes a heater for heating the semiconductor laser; and
heating by heat generated from the heater is so controlled, so as to follow the change of the oscillation characteristic of the semiconductor laser.

23. The illumination light source according to claim 12, wherein:
the reflector includes a diffraction grating;
the reflection wavelength is set by a Bragg reflection by the diffraction grating;
the semiconductor laser further includes an output controlling electrode, to which the drive current is supplied and which controls an output of the semiconductor laser, and includes a wavelength controlling electrode, to which a wavelength controlling current is supplied and which controls the oscillation wavelength of the semiconductor laser through a temperature control of the diffraction grating by an injection of the wavelength controlling current; and
the wavelength controlling current is pulse-modulated, so as to follow the pulse modulation of the drive current.

24. The illumination light source according to claim 1, wherein a reflectance of the reflector is preferably 1 to 10%.

25. The illumination light source according to claim 1, wherein a narrow band width of the reflector is 5 nm or shorter.

26. A laser projection device, comprising:
at least one illumination light source according to claim 1; and
an optical system for projecting a laser light emitted from the illumination light source.

27. The laser projection device according to claim 26, wherein a lateral mode of the laser light emitted from the laser light source is a multimode.

28. The laser projection device according to claim 26, wherein a wavelength interval of a vertical mode of the laser light emitted from the laser light source is 1 nm or longer.

29. The laser projection device according to claim 26,
wherein the laser projection device includes two illumination light sources, and
wherein the reflection wavelengths of the reflectors of the illumination light sources are different from each other.

30. The laser projection device according to claim 29, further comprising a light guiding plate, on which the laser light emitted from one of the illumination light sources is incident.

* * * * *